(12) United States Patent
Kikuchi et al.

(10) Patent No.: US 7,186,928 B2
(45) Date of Patent: Mar. 6, 2007

(54) ELECTRONIC DEVICE INCLUDING CHIP PARTS AND A METHOD FOR MANUFACTURING THE SAME

(75) Inventors: Hideo Kikuchi, Tokyo (JP); Junichi Sasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/522,686

(22) PCT Filed: Aug. 1, 2003

(86) PCT No.: PCT/JP03/09807

§ 371 (c)(1),
(2), (4) Date: Apr. 12, 2005

(87) PCT Pub. No.: WO00/00000

PCT Pub. Date: Jan. 1, 2001

(65) Prior Publication Data

US 2005/0248909 A1 Nov. 10, 2005

(30) Foreign Application Priority Data

Aug. 1, 2002 (JP) .............................. 2002-225416

(51) Int. Cl.
*H05K 9/00* (2006.01)
(52) U.S. Cl. .................. 174/350; 174/377; 174/390
(58) Field of Classification Search ........... 174/135, 174/33, 32, 350, 354, 360, 363, 368, 377, 174/390

See application file for complete search history.

(56) References Cited

FOREIGN PATENT DOCUMENTS

| EP | 0 812 015 A1 | 12/1997 |
|----|--------------|---------|
| EP | 1 146 591 A2 | 10/2001 |
| JP | 2-113341 | 9/1990 |
| JP | 2-244661 | 9/1990 |
| JP | 9-307273 | 11/1997 |
| JP | 2940478 | 6/1999 |
| JP | 2001-15976 | 1/2001 |
| JP | 2001-36197 | 2/2001 |

*Primary Examiner*—Jinhee Lee
(74) *Attorney, Agent, or Firm*—McGinn IP Law Group, PLLC

(57) ABSTRACT

In a shielding configuration of a chip part, a shielding effect and a cooling effect are sufficiently obtained at the same time. In an electronic device including a chip part to be disclosed, a shielding conductor includes a ceiling plate section covering the chip part and side plate sections which are formed to be united with the ceiling plate section and to be at a position lower than the ceiling plate section and which are arranged on both sides in a horizontal direction of the chip part, and openings are formed in both side ends in a front-rear direction of the shielding conductor to open both sides in a front-rear direction of the chip part, and the side plate sections of the shielding conductor are electrically connected via a plurality of shielding bumps in the front-rear direction to a ground layer pattern of a mounting substrate.

19 Claims, 22 Drawing Sheets

FIG. 2
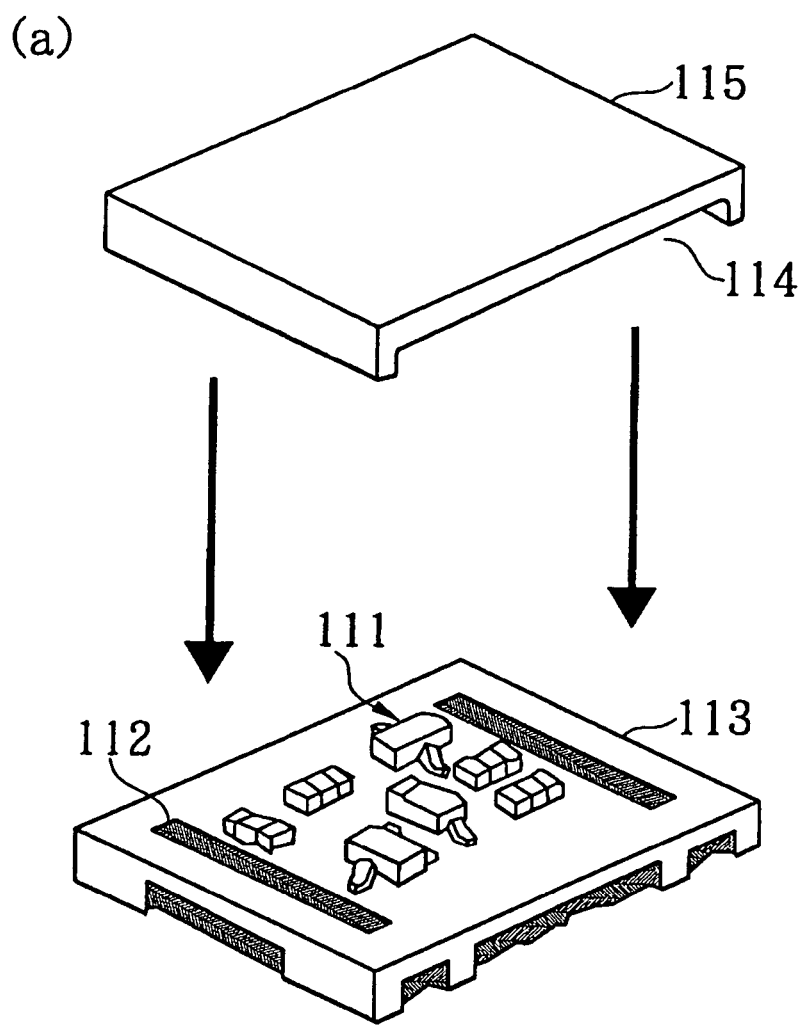
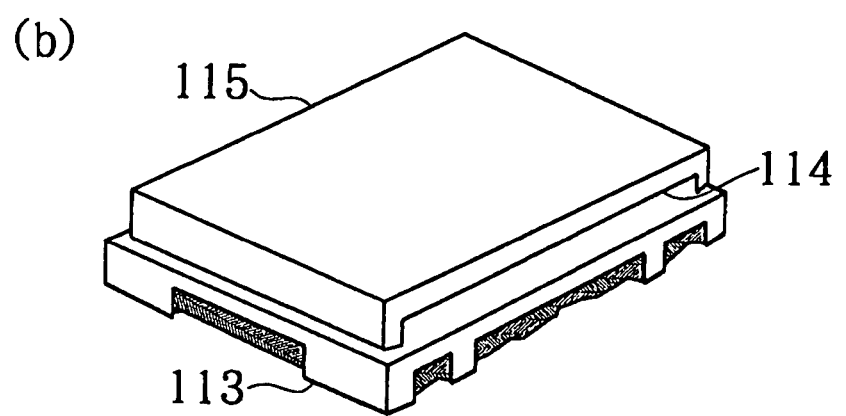

F I G. 3
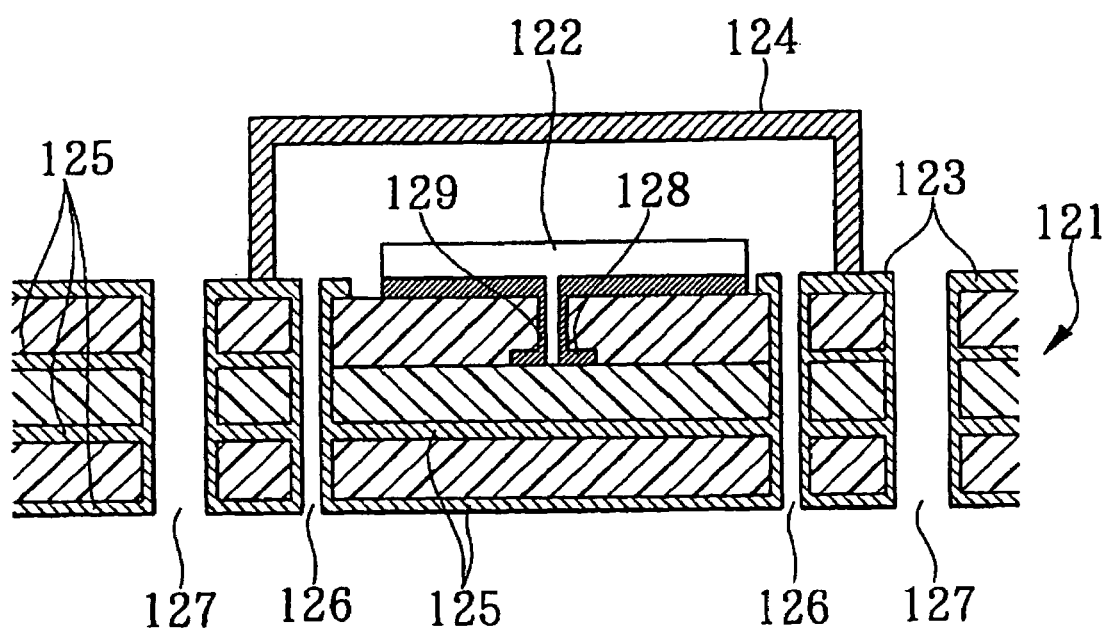

FIG. 6
(a) 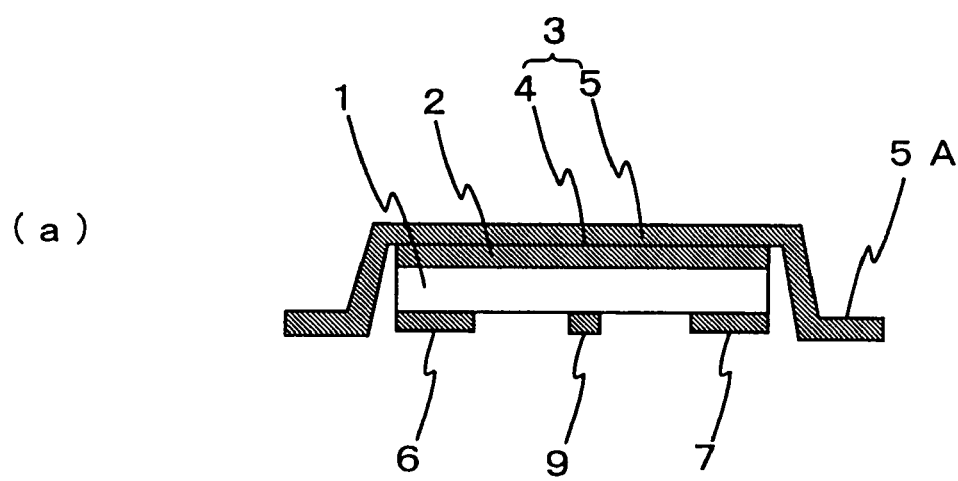
(b) 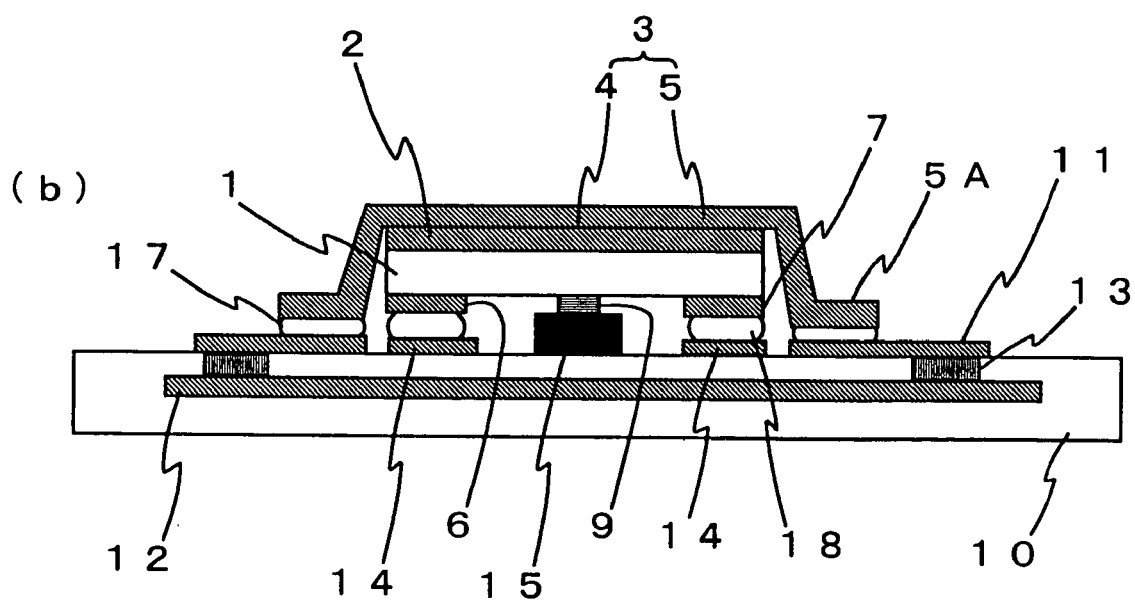

FIG. 7
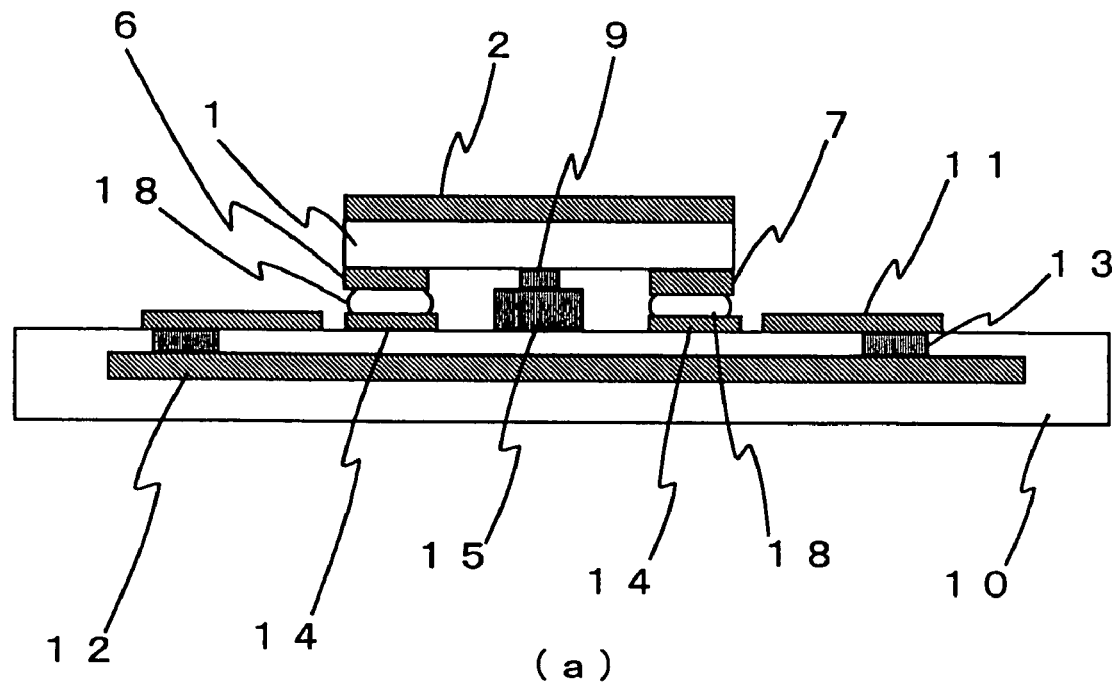
(a)
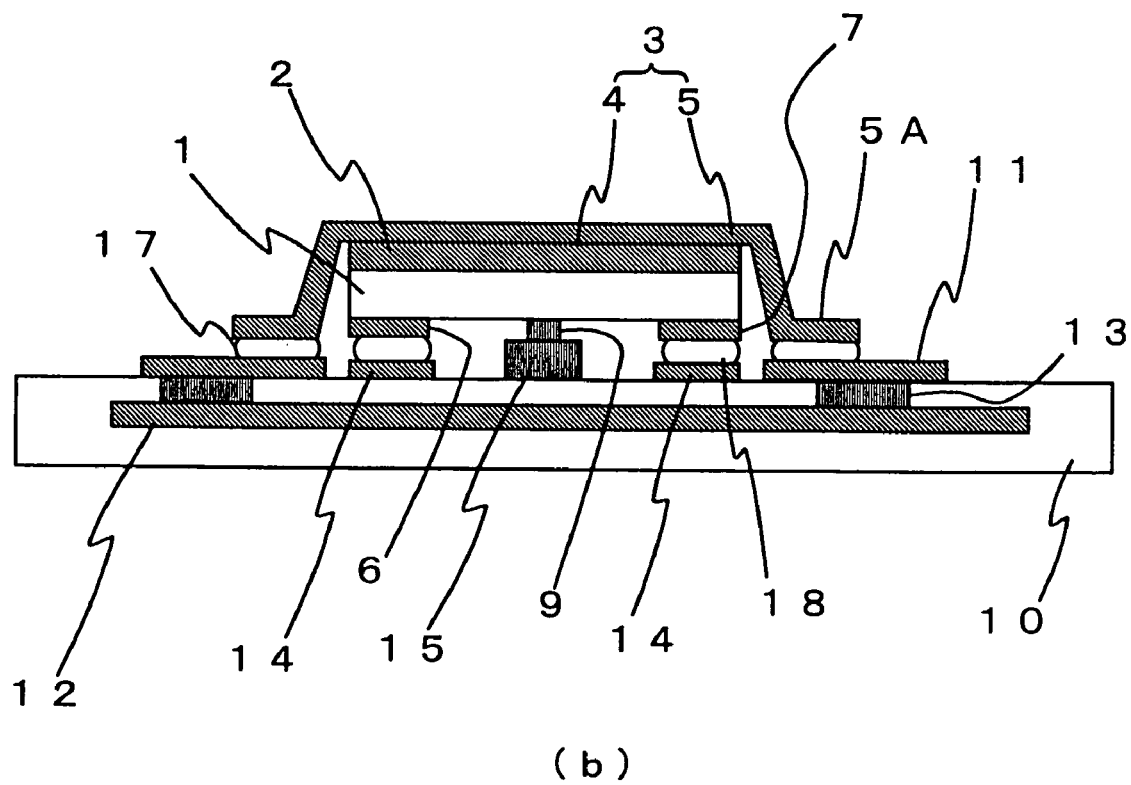
(b)

ELECTRONIC DEVICE INCLUDING CHIP PARTS AND A METHOD FOR MANUFACTURING THE SAME

TECHNICAL FIELD

The present invention relates to an electronic device including chip parts and a method of manufacturing the same, and in particular, to an electronic device including chip parts and a method of manufacturing the same in which Electro-magnetic Interference (EMI) for the chip parts is reduced.

RELATED ART

In an electronic device including chip parts which is constructed by mounting various chip parts such as a semiconductor chip, a chip capacitor, and a chip resistor on a mounting substrate, it is common practice that the chip parts are electromagnetically shielded to reduce EMI, that is, to obtain an effect of shielding the chip parts from radiation noise.

For example, Japanese Patent No. 2940478 (Japanese Patent Application Laid-Open No. 10-12675) (first prior art) discloses an electronic device including chip parts in which by passing a signal through an inner layer of a wiring substrate, electromagnetic radiation (radiation noise) can be almost completely suppressed. In the device, as can be seen from FIG. 1, a mounting substrate 100 including a surface layer 101 and a signal layer 102 as an inner layer are used, and a surface of a ceramic die 103 constituting a resistor chip is covered with a ground (GND) cover film 104. The film 104 is connected via a GND connection terminal 105 to the surface later 101 on one hand, and a resistor film 106 is connected via a signal connection terminal 107 to the signal layer 102.

According to the electronic device configured as above, the signal layer 102 which is part of a circuit passing through the resistor film 106 is placed on an inner side of the surface layer 101 completely shielded from an external space, and hence can be shielded from the external space.

Furthermore, for example, Japanese Patent Application Laid-open No. 2001-15976 (second prior art) discloses an electronic device including chip parts in which a shielding cap joining section and an element mounting section are formed on the same plane of a mounting substrate, and side surfaces of the shielding cap include openings. In the electric device, as shown in FIG. 2(*a*), on a mounting substrate 113 in which elements (chip parts) 111 are mounted and joining pads 112 such as solder are formed, a shielding cap 115 including an opening 114 in a side surface thereof is set and then joining of the shielding cap 115 and mounting of the elements 111 are simultaneously conducted to thereby manufacture an electronic device in which the side surface of the shielding cap has the opening 114 as shown in FIG. 2(*b*). According to the electronic device configured as above, since the side surface of the shielding cap has the opening 114, the shielding from the external space can be achieved while improving convection heat transfer efficiency and a gas discharge characteristic during solder reflow.

Additionally, for example, Japanese Patent Application Laid-Open No. 9-307273 (third prior art) discloses an electronic device including chip parts including a shielding configuration to effectively shield high-frequency circuits and signal lines on a mounting substrate from electromagnetic waves propagating through a space and the substrate. The electronic device is configured as shown in FIG. 3 such that a high-frequency circuit 122 including a large number of chip parts formed on a surface of a multilayered substrate 121 is covered with a shielding case 124 connected to a ground pattern 123 formed on a surface of the multilayered substrate 121, ground layers formed on inner and rear layers of the multilayered substrate 121 are connected using via holes 126 to the ground pattern 123, and slits 127 are formed to pass through the front and rear surfaces of the multilayered substrate 121. Additionally, an output signal line 128 of the high-frequency circuit 122 is formed to pass through the inner layer of the multilayered substrate 121 on one side, and the high-frequency circuit 122 is connected to the output signal line 128 using a via hole 129.

In accordance with the electronic device configured as above, the ground pattern 123, the ground layer 125, and the via hole 126 are used to form a wall of a ground surface in the multilayered substrate 121 and an upper surface and side surfaces of the high-frequency circuit 122 are covered with the shielding case 124 to surround an overall circumference of the high-frequency circuit 122 by ground. Moreover, by forming slits 127 on an outer side of the via hole 126, the high-frequency circuit 122 and the output signal line 128 can be isolated from the external circuits of the multilayered substrate 121.

PROBLEM TO BE SOLVED BY THE INVENTION

However, in the electronic devices including chip parts according to the first to third prior arts, there exists a problem of difficulty to simultaneously and sufficiently obtain the shielding effect and the cooling effect.

That is, in the electronic device including chip parts, when a higher function is required, the number of chip parts mounted on the mounting substrate has a tendency to increase. However, in association therewith, the quantity of heat generated during operation of the electronic device inevitably increases. Therefore, it is an important object to obtain a sufficient shielding effect and to adopt sufficient heat dissipating measures at the same time. When the prior arts are viewed from that point of view, since the ceramic die 103 constituting the resistor chip is sealed by the GND film 14 in the first prior art shown in FIG. 1 and it is difficult to dissipate generated heat into the periphery, the sufficient cooling effect cannot be obtained. Additionally, since the signal layer 102 is disposed to pass through the inner layer of the mounting substrate 100 in the first prior art, there exists also a drawback that degrees of freedom are restricted in the designing.

Moreover, since the shielding cap 115 has the opening 114 in its side surfaces in the second prior art shown in FIG. 2, the cooling effect can be obtained using the opening 114; however, there exits a drawback that the shielding effect is not sufficient. Furthermore, since the high-frequency circuit 122 is substantially sealed by the shielding case 124 in the configuration of the third prior art shown in FIG. 3, there exists a drawback as in the first prior art that the generated heat cannot be easily dissipated around and hence the sufficient cooling effect cannot be obtained.

It is an object of the present invention, which has been devised in consideration of the situation described above, to provide an electronic device and a method of manufacturing the same in which the shielding effect and the cooling effect can be simultaneously and sufficiently obtained in the shielding configuration of the chip parts.

DISCLOSURE OF THE INVENTION

To achieve the objects, there is provided an electronic device including a shielding conductor to be united with a chip part, characterized in that an upper surface of the chip part is coated with the shielding conductor, the shielding conductor includes a ceiling plate section covering the chip part and side plate sections which are formed to be united with the ceiling plate section and to be at a position lower than the ceiling plate section and which are arranged on both sides in a horizontal direction of the chip part, side plates do not exist in both side ends in a front-rear direction of the shielding conductor, and the side plate sections are electrically connected via a plurality of connecting means to a ground layer of a mounting substrate.

In accordance with the invention, there is provided an electronic device including a chip part in which the chip part is mounted on a surface of a mounting substrate, an upper surface of the chip part is coated with a shielding conductor to be united with the chip part, and the shielding conductor is electrically connected to a ground layer of the mounting substrate, characterized in that the shielding conductor includes a ceiling plate section covering the chip part and side plate sections which are formed to be united with the ceiling plate section and to be at a position lower than the ceiling plate section and which are arranged on both sides in a horizontal direction of the chip part, and openings are formed in both side ends in a front-rear direction of the shielding conductor to open both sides in a front-rear direction of the chip part, and the side plate sections of the shielding conductor are electrically connected via a plurality of connecting means in the front-rear direction to the ground layer of the mounting substrate.

Furthermore, in accordance with the invention, there is provided an electronic device including a chip part in which the chip part is mounted on a surface of a mounting substrate, an upper surface of the chip part is coated with a shielding conductor to be united with the chip part, and the shielding conductor is electrically connected to a ground layer of the mounting substrate, characterized in that the shielding conductor includes a ceiling plate section covering the chip part and side plate sections which are formed to be united with the ceiling plate section and to be at a position lower than the ceiling plate section and which are arranged on both sides in a horizontal direction of the chip part, and both end sides in a front-rear direction of the shielding conductor project from both side ends of the chip part, and an electromagnetic wave absorber is disposed between at least from the both side ends in a front-rear direction of the chip part to the both side ends in a front-rear direction of the shielding conductor, and the side plate sections of the shielding conductor are electrically connected via a plurality of connecting means in the front-rear direction to the ground layer of the mounting substrate.

Furthermore, in accordance with the invention, there is provided an electronic device including a chip part, characterized in that the chip part includes a two-terminal chip part.

Furthermore, in accordance with the invention, there is provided an electronic device including a chip part, characterized in that in the shielding conductor, the shielding conductor width W is selected to have a size larger than an area in which terminals of the chip part exist, by at least twice a harmonic mean of height H of the ceiling plate section and length L of the opening in the horizontal direction of the ceiling plate section.

Furthermore, in accordance with the invention, there is provided an electronic device including a chip part, characterized in that in the shielding conductor, end sections of the opening of the shielding conductor are of a size larger than an area in which terminals of the chip part exist, by at least length L of the opening in the horizontal direction of the ceiling plate section.

Furthermore, in accordance with the invention, there is provided an electronic device including a chip part, characterized in that the connecting means used are at least four in number.

Furthermore, in accordance with the invention, there is provided an electronic device including a chip part, characterized in that a hole section is formed in the ceiling plate section of the shielding conductor to expose the chip part.

Furthermore, in accordance with the invention, there is provided an electronic device including a chip part, characterized in that a spring substance having elasticity is used as the shielding conductor.

Furthermore, in accordance with the invention, there is provided an electronic device including a chip part, characterized in that shape memory metal having a characteristic of a spring is used as the shielding conductor, a hole section is formed in the shape memory metal to expose the chip part, and the chip part is pushed by the characteristic of a spring of end sections of the hole section.

Furthermore, in accordance with the invention, there is provided an electronic device including a chip part, characterized in that a shielding conductor also serving as a cathode conductor is used in place of the shielding conductor and the upper surface, side surfaces, and a part of surfaces of the chip part are covered by the shielding conductor also serving as a cathode conductor.

Furthermore, in accordance with the invention, there is provided an electronic device including a chip part, characterized in that a bump or a conductor having elasticity is used as the connecting means.

Furthermore, in accordance with the invention, there is provided an electronic device including a chip part, characterized in that an array-shaped chip part is used in place of the chip part and the array-shaped chip part includes a plurality of two-terminal chip parts integrated in a front-rear direction.

Furthermore, in accordance with the invention, there is provided an electronic device including a chip part, characterized in that two electrodes are formed on a mounting surface of the two-terminal chip part and both of the electrodes are connected to surface layer electric wiring formed in the horizontal direction.

Furthermore, in accordance with the invention, there is provided an electronic device including a chip part, characterized in that on a mounting surface of each of a plurality of two-terminal chip parts, only one of the electrodes is formed.

Furthermore, in accordance with the invention, there is provided an electronic device including a chip part, characterized in that the one of the electrode is connected to surface layer electric wiring formed in the horizontal direction and an optical waveguide is arranged in the horizontal direction in the mounting substrate below the array-shaped chip.

Furthermore, in accordance with the invention, there is provided a method of manufacturing an electronic device including a chip part in which the chip part is mounted on a surface of a mounting substrate, an upper surface of the chip part is coated with a shielding conductor, and the shielding conductor is electrically connected to a ground layer of the mounting substrate, characterized by comprising a step of assembling the chip part with the shielding conductor into a unit by using a shielding conductor including a ceiling plate section covering the chip part and side plate sections which are formed to be united with the ceiling plate section and to be at a position lower than the ceiling plate section and which are arranged on both sides in a horizontal direction of the chip part and by coating an upper surface of the chip part with the ceiling plate section and a step of using a mounting substrate in which a ground layer is formed, arranging on the mounting substrate the shielding conductor assembled with the chip part into a unit, mounting the chip part on a surface of the mounting substrate, and electrically connecting the shielding conductor to the ground layer at the same time.

Furthermore, in accordance with the invention, there is provided a method of manufacturing an electronic device including a chip part in which the chip part is mounted on a surface of a mounting substrate, an upper surface of the chip part is coated with a shielding conductor, and the shielding conductor is electrically connected to a ground layer of the mounting substrate, characterized by comprising a step of using a mounting substrate in which a ground layer is formed, arranging the chip part on the mounting substrate, and mounting the chip part on a surface of the mounting substrate and a step of using a shielding conductor including a ceiling plate section covering the chip part and side plate sections which are formed to be united with the ceiling plate section and to be at a position lower than the ceiling plate section and which are arranged on both sides in a horizontal direction of the chip part, arranging the shielding conductor on the mounting substrate, electrically connecting the shielding conductor to the ground layer, and covering an upper surface of the chip part with the ceiling plate section.

Furthermore, in accordance with the invention, there is provided a method of manufacturing an electronic device including a chip part, characterized in that a plurality of connecting means are used when the shielding conductor is electrically connected to the ground layer.

BRIEF DESCRIPTION OF DRAWINGS

FIG. 2 is a perspective view showing a configuration of a conventional electronic device including chip parts (second prior art).

FIG. 3 is a cross-sectional view showing a configuration of a conventional electronic device including chip parts (third prior art).

FIG. 6 is a process chart showing a first manufacturing method of the electronic device in a process order.

FIG. 7 is a process chart showing a second manufacturing method of the electronic device in a process order.

Figure 1:
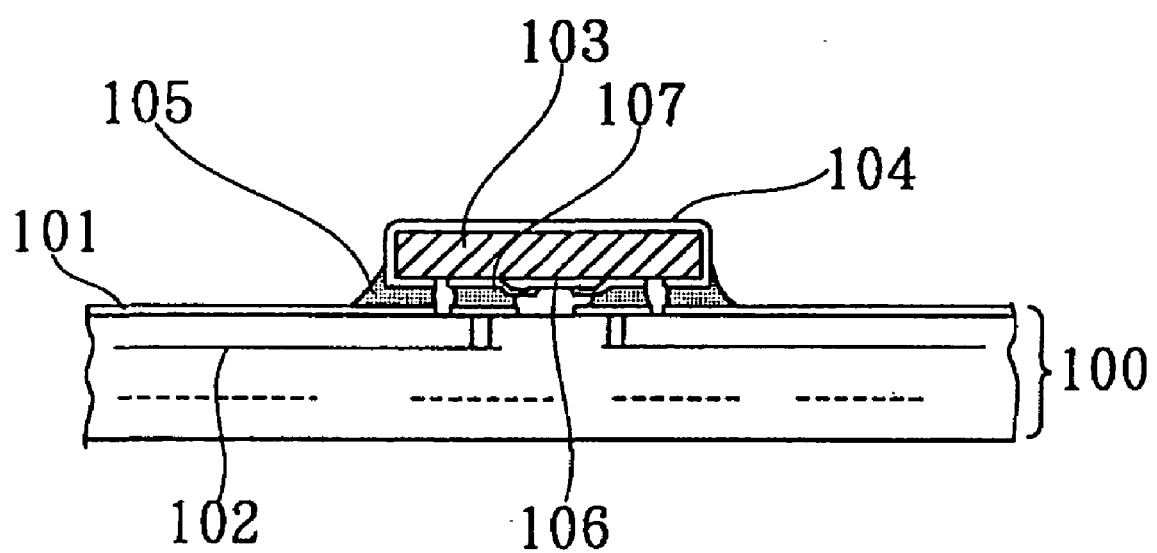
FIG. 1 is a cross-sectional view showing a configuration of a conventional electronic device including chip parts (first prior art).

In this connection, numeral 1 indicates a chip part. Numeral 2 is a cathode. Numeral 3 is a shielding conductor. Numeral 4 is a ceiling plate section. Numeral 5 is a side plate section. Numerals 5A and 21A are flat planes. Numerals 6 and 6A are anode electrodes. Numerals 7 and 7A are cathode electrodes. Numerals 8 and 23 are openings. Numeral 9 is a light emitting section. Numeral 10 is a mounting substrate. Numeral 11 is a ground conductor pattern. Numeral 12 is a ground layer. Numeral 13 is a via hole. Numeral 14 is a land pattern. Numeral 15 is an optical waveguide. Numerals 16A, 16B, 26, 26A, and 26B are surface layer electric wiring. Numeral 17 is a shielding bump. Numeric 18 is a signal bump. Numeric 19 is a gap. Numeral 20 is a hole section. Numeral 21 is a shielding conductor also serving as a cathode conductor. Numeral 22 is solder resist. Numeral 24 is a conductor having elasticity. Numeral 25 is an array-shaped chip part. Numeral 27 is an optical waveguide.

BEST MODE FOR CARRYING OUT THE INVENTION

Next, referring to the drawings, description will be given of embodiments of the present invention. The description will be specifically given by use of embodiments.

First Embodiment

Figure 4:
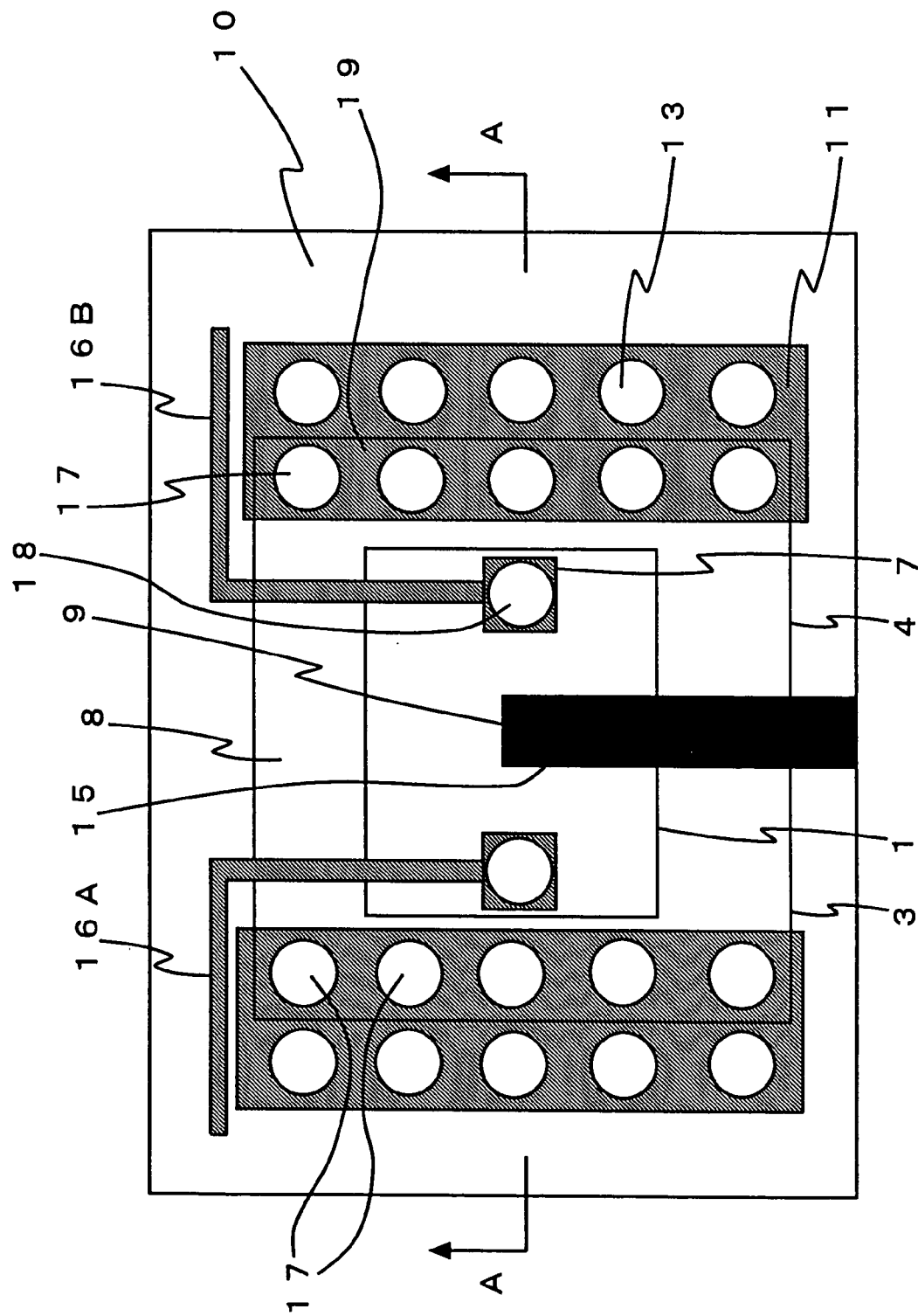
FIG. 4 is a plan view showing a first embodiment of an electronic device including chip parts in accordance with the present invention.
Figure 5:
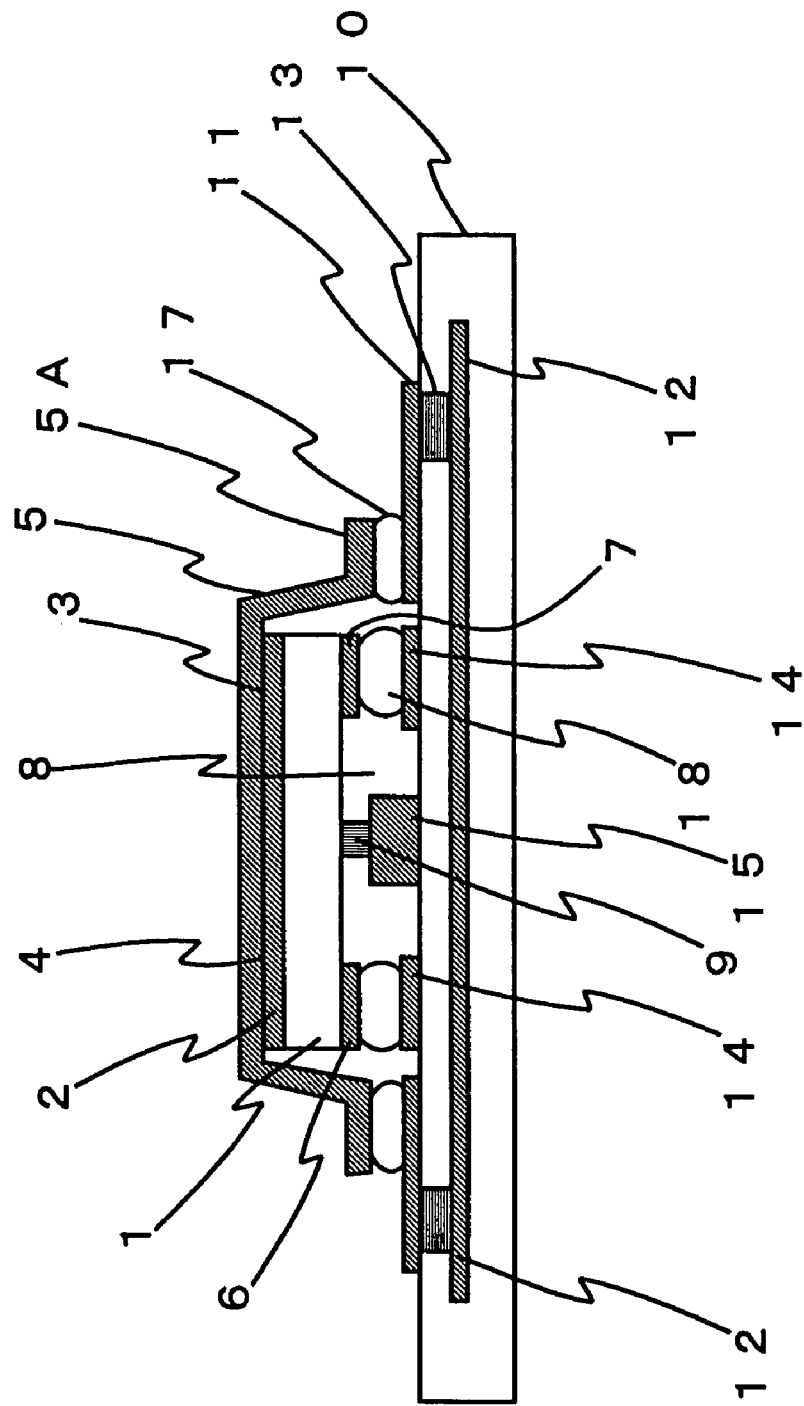
FIG. 5 is a cross-sectional view taken along A—A of FIG. 4.

FIG. 4 is a plan view showing a first embodiment of an electronic device including chip parts of the present invention. FIG. 5 is a cross-sectional view taken along A—A of FIG. 4. FIG. 6 is a process chart showing a first manufacturing method of the electronic device in a process order. FIG. 7 is a process chart showing a second manufacturing method of the electronic device in a process order.

In an electronic device including chip parts of this example, an upper surface (a rear surface) serving as a cathode 2 of a chip part 1 including, for example, a Vertical Cavity Surface Emitting Laser (VCSEL) is covered with a shielding conductor 3 to be an integrated unit on one hand, while a surface of the chip part 1 is mounted on a surface of the mounting substrate 10. Furthermore, both end surfaces (flat planes 5A of side plate sections 5, which will be described later) in the horizontal direction of the shielding conductor 3 are electrically connected to a ground conductor pattern 11 on a surface of the mounting substrate 10 on one hand, and both ends in the front-rear direction of the shielding conductor 3 are opened to form an opening 8.

For the mounting substrate 10, an insulator substrate such as a ceramic substrate or a glass epoxy board is used, and the ground conductor pattern 11 is formed on a surface thereof, a ground layer 12 is formed therein, and the ground layer 12 and the ground pattern 11 are conductively linked with each other using the via hole 13. Moreover, on the surface that is a mounting surface of the chip part 1, the anode electrode 6, the cathode electrode 7, and the light emitting section 9 are formed; and at positions on the surface of the mounting substrate 10 opposing the anode electrode 6 and the cathode electrode 7, formed are land patterns 14 including respectively copper layers. Additionally, on the surface of the mounting substrate 10, an optical waveguide 15 is formed in the front-rear direction, the waveguide 15 receiving and propagating optical signals from the light emitting section 9 of the chip part 1; on the other hand, in the front-rear direction and in the horizontal direction, a surface layer electric wiring 16A and a surface layer electric wiring 16B to be connected to the anode electrode 6 and the cathode electrode 7 of the chip part 1 are formed. The optical waveguide 15 includes multimode optical waveguide structure having a core diameter of, for example, 50 micrometers (μm), and one end section thereof to receive optical signals from the light emitting section 9 is formed to include an inclined surface having an angle of almost 45 degrees on one hand, and another end thereof is formed to be drawn from the opening 8 in the front-rear direction of the ceiling plate section 4. As the optical waveguide 15, optical fiber of step index type or GI type can be used.

The chip part 1 including a VCSEL is, for example, about 0.4 mm square and about 0.2 mm thick, and the light emitting section 9 is formed on a substantially central section of the chip part 1. Additionally, the anode electrode 6 and the cathode electrode 7 are about 0.08 mm in size and both electrodes 6 and 7 are arranged to be apart from the light emitting section 9 by a distance of about 0.125 mm. The chip part 1 configures a two-terminal chip part in which the anode electrode 6 and the cathode electrode 7 are formed as described above, and a current path is formed in the horizontal direction in which both electrodes 6 and 7 are linked with each other.

For the shielding conductor 3, a conductor plate such as a copper or an aluminum plate is used and is larger in size than the chip part 1, that is, has a length from 0.5 mm to 0.8 mm in the horizontal direction and a length from 0.5 mm to 1 mm in the front-rear direction to cover the chip part 1. The conductor 3 includes a ceiling plate section 4 to cover a cathode 2 on a rear surface of the chip part 1 and a pair of side plate sections 5 which are united with the ceiling plate section 4 and are bent to be at a position 0.2 mm to 0.4 mm lower than the ceiling plate section 4, the side plate sections 5 being arranged on both sides in the horizontal direction of the chip part 1. The paired side plate sections 5 are configured such that a flat plane 5A thereof extends in the front-rear direction to be electrically connected via, for example, five shielding bumps (connecting units) 17 each having a diameter of 100 μm to the ground conductor pattern 11 on a surface of the mounting plate 10. Furthermore, the anode electrode 6 and the cathode electrode 7 of the chip part 1 are connected to the surface layer electric wirings 16A and 16B via, for example, signal bumps 18 each having a diameter of 100 μm. For each of the shielding bumps 17 and the signal bumps 18 serving as electric contacts (connecting units), a spherical conductor of solder, metal, or the like is used. In addition, at a position at which the shielding bump 17 is not disposed between the side plate sections 5 of the shielding conductor 3 and the ground conductor pattern 11 of the mounting substrate 10, there exists a gap 19.

Next, by referring to FIG. 6, description will be given of a first manufacturing method of the electronic device including chip parts of this example.

First, as shown in FIG. 6(a), there is beforehand prepared a chip part 1 in which a cathode 2 is formed on a rear surface thereof and which includes, on one hand, a vertical cavity surface emitting laser including an anode electrode 6, a cathode electrode 7, and a light emitting section 9 formed on a surface thereof as a mounting surface. A shielding conductor 3 in which a ceiling plate section 4 and both side plate sections 5 are formed is prepared. By covering the cathode 2 on the rear surface of the chip part 1 with the ceiling plate section 4 using conductive adhesive, the chip part 1 is assembled to be united with the shielding conductor 3.

Next, there is prepared a mounting substrate 10 as shown in FIG. 6(b) in which a ground conductor pattern 11 is formed on the surface, a ground layer 12 is formed therein, the ground layer 12 is linked via a via hole 13 with the ground conductor pattern 11, and a land pattern 14 is formed at a desired position. Next, the shielding conductor 3 assembled to be united with the chip part 1 is arranged on the mounting substrate 10, the flat planes 5A of the both side plate sections 5 of the shielding conductor 3 are aligned with the ground conductor pattern 11 on the surface of the mounting substrate 10, and the anode electrode 6 and the cathode electrode 7 on the surface of the chip part 1 are aligned with the land pattern 14 on the surface of the mounting substrate 10. Thereafter, the shielding bump 17 is placed between the flat planes 5A of the shielding substrate 3 and the ground conductor pattern 11; and the signal bumps 18 are placed between the land pattern 14 and the anode electrode 6, and between the land patter 14 and the cathode electrode 7 to thereby mount the chip part 1 on the mounting substrate 10; and, at the same time, the shielding conductor 3 is electrically connected to the ground conductor pattern 11 of the mounting substrate 10 to completely manufacture an electronic device including chip parts as shown in FIGS. 4 and 5.

In this regard, the connection between the flat planes 5A and the ground conductor pattern 11 and that between the land pattern 14 and the anode electrode 6 and the cathode electrode 7 described above are achieved by use of a heating furnace such that the mounting substrate 10 is passed through the inside of the furnace to thereby deforming the shielding bumps 17 and the signal bumps 18 by heat. Or, it is also possible to deform the shielding bumps 17 and the signal bumps 18 by compression bonding.

In this connection, a plurality of shielding bumps 17 may be densely disposed such that the bumps are molten to be united into one shielding bump during the deformation by heat.

In accordance with the first manufacturing method, the shielding conductor 3 beforehand assembled with the chip part 1 into one unit is used such that the shielding conductor 3 is aligned on the mounting substrate 10, the chip part is mounted on the surface of the land pattern 14 of the mounting substrate using the signal bumps 18; at the same time, the shielding conductor 3 is connected to the ground conductor pattern 11 of the mounting substrate 10. Therefore, the connection of the chip part 1 to the surface of the mounting substrate 10 and that of the shielding conductor 3 to the mounting substrate 10 can be achieved in one process, and hence the manufacturing processes can be simplified.

Next, by referring to FIG. 7, description will be given of a second manufacturing method of the electronic device including chip parts of this example.

First, as shown in FIG. 6(a), there is beforehand prepared a chip part 1 in which a cathode 2 is formed on a rear surface thereof and which includes, on one hand, a vertical cavity surface emitting laser including an anode electrode 6, a cathode electrode 7, and a light emitting section 9 formed on a surface thereof as a mounting surface. There is prepared a mounting substrate 10 in which a ground conductor pattern 11 is formed on the surface, a ground layer 12 is formed therein, the ground layer 12 is linked via a via hole 13 with the ground conductor pattern 11, and a land pattern 14 is formed at a desired position. Next, the chip part 1 is arranged on the mounting substrate 10, the anode electrode 6 and the cathode electrode 7 are aligned with the land pattern 14 on the surface of the mounting substrate 10, and the chip part 1 is mounted on the surface of the mounting substrate 10 with the signal bumps 18 placed between the anode electrode 6 and the cathode electrode 7 and the land pattern 14.

Next, as shown in FIG. 7(b), a shielding conductor 3 in which a ceiling plate section 4 and both side plate sections 5 are formed is prepared. Next, the shielding conductor 3 is arranged on the mounting substrate 10, the flat planes 5A of the both side plate sections 5 of the shielding conductor 3 are aligned with the ground conductor pattern 11 on the surface of the mounting substrate 10, and the rear surface of the chip part 1 is aligned with the ceiling plate section 4 of the shielding conductor 3. Thereafter, the shielding bumps 17 are placed between the flat planes 5A of the shielding conductor 3 and the ground conductor pattern 11, conductive adhesive is placed between the ceiling plate section 4 of the shielding conductor 3 and the rear surface of the chip part 1 to connect the shielding conductor 3 to the ground conductor pattern 11 of the mounting substrate 10; and the rear surface of the chip part 1 is fixed onto the ceiling plate section 4 to thereby cover the rear surface by the ceiling plate section 4 to completely manufacture an electronic device including chip parts as shown in FIGS. 4 and 5.

In this regard, the connection between the flat planes 5A and the ground conductor pattern 11 and that between the land pattern 14 and the anode electrode 6 and the cathode electrode 7 described above are achieved, like in the first manufacturing method, by use of a heating furnace or a compression bonding method in which the shielding bumps 17 and the signal bumps 18 are deformed by heat.

In accordance with the second manufacturing method, the chip part 1 is beforehand mounted on the surface of the mounting substrate 10, the shielding conductor 3 is aligned with the mounting substrate 10, and the shielding conductor 3 is connected to the mounting substrate 10 to cover the substrate 10 at the same time. Therefore, the mounting of the chip part 1 is conducted before the connection of the shielding conductor 3, and hence degrees of freedom are obtained in the mounting of the chip part 1.

In accordance with the electronic device including chip parts of this example manufactured in the first and second manufacturing methods described above, the opening 8 is configured in both side end surfaces in the front-rear direction of the shielding conductor 3 connected to the mounting substrate 10, and hence heat generated from a plurality of chip parts 1 mounted on the surface of the mounting substrate 10 is dissipated through the openings 8 to an external space of the shielding conductor 3. Therefore, a sufficient dissipation effect can be obtained. Additionally, by forming the contour of the shielding conductor 3 into a particular contour, which will be described below, a sufficient shielding effect can also be obtained together with the sufficient dissipation effect. Next, referring to FIGS. 8 and 9, description will be given of a principle to obtain the sufficient shielding effect.

Figure 8:
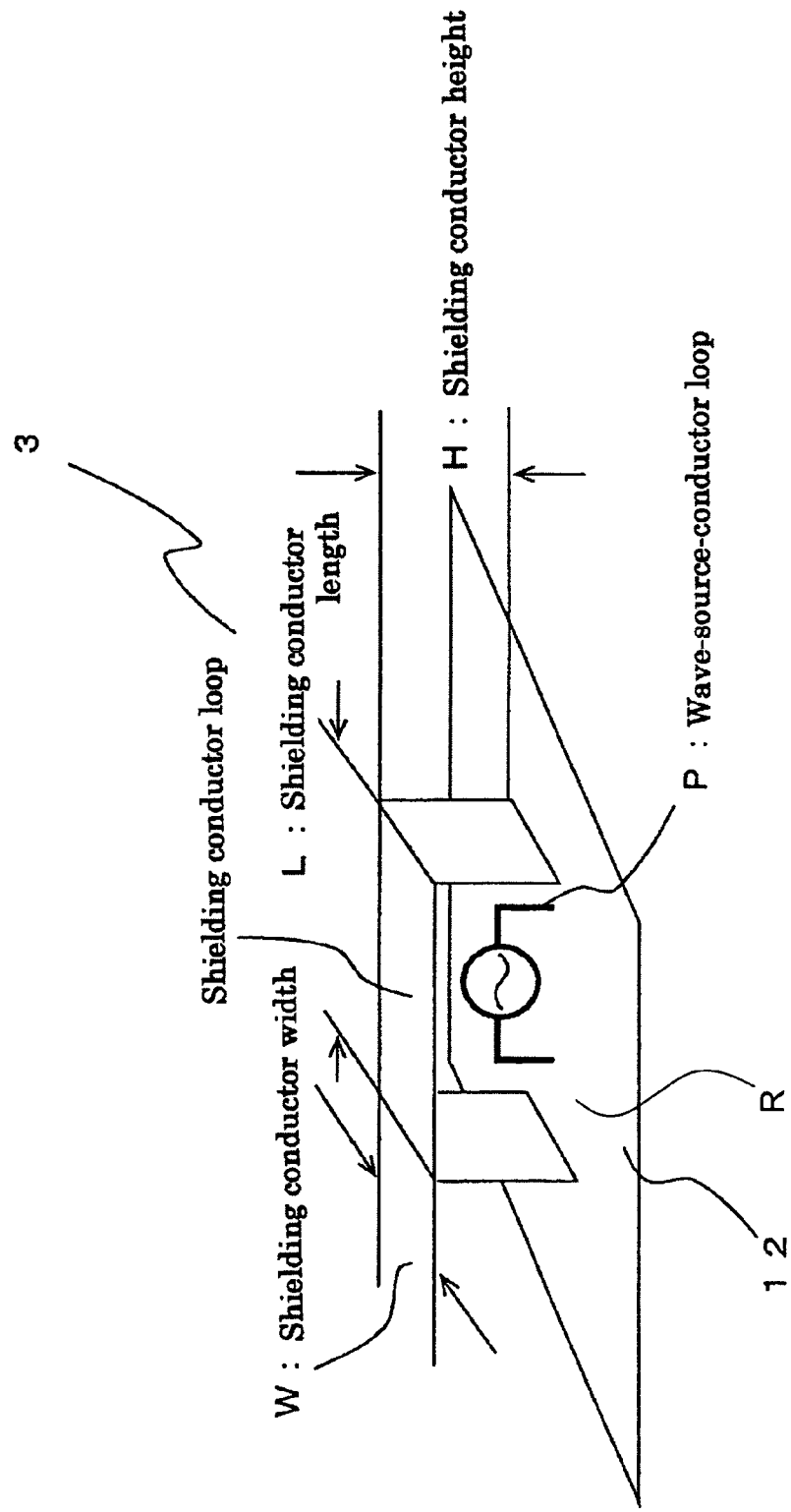
FIG. 8 is a diagram schematically showing a shielding conductor used in the electronic device.
Figure 9:
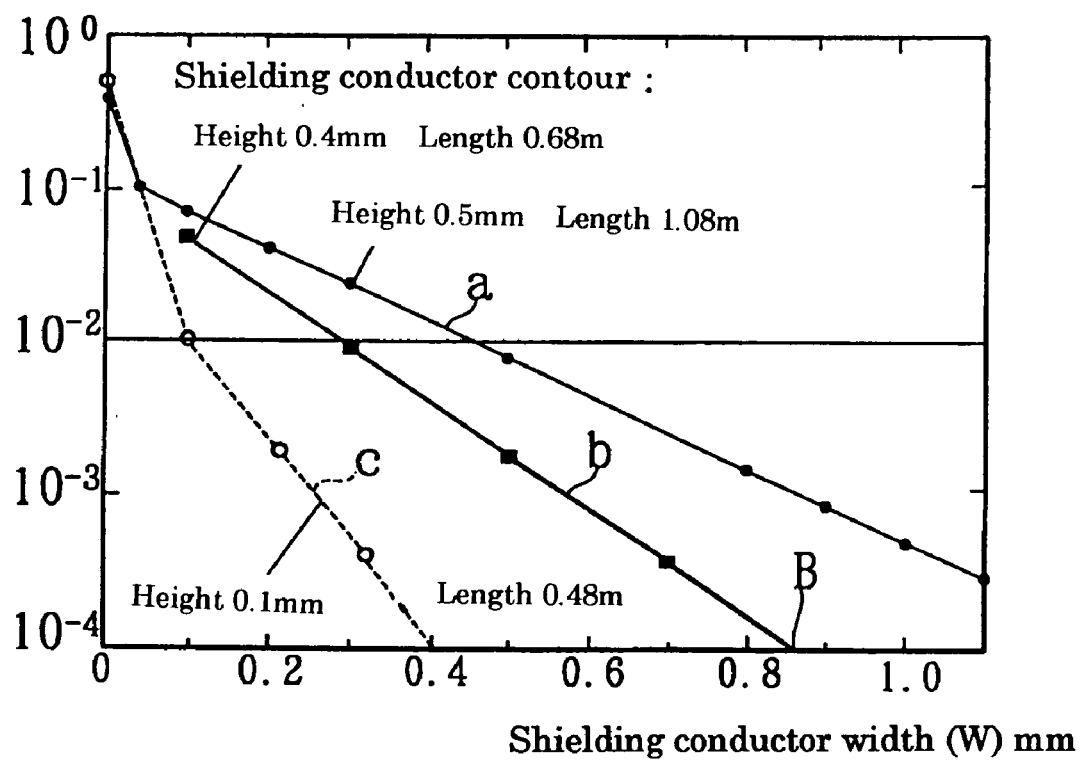
FIG. 9 is a diagram showing simulated results of a shielding effect when the shielding conductor is used.

FIG. 8 is a diagram schematically showing the shielding conductor 3 used in the electronic device including chip parts of this example. In the diagram, character L indicates a dimension of width of the shielding conductor 3, character H indicates a dimension of height thereof, and character L indicates a dimension of length thereof. Furthermore, FIG. 9 shows simulated results of a shielding effect when the shielding conductor 3 is used and a relationship between shielding conductor width W (abscissa) and radiation noise (ordinate). The simulated results are calculated using a shielding conductor of a size less than a quarter of a wavelength of a radiated electromagnetic field, and the simulated results lead to recognition as below.

That is, a current flowing from the chip part 1 to the ground conductor pattern 11 of the mounting substrate 10 forms a current loop circulating in a direction perpendicular to the surface of the mounting substrate 10 to form a wave-source-conductor loop P as shown in FIG. 8. In this configuration, the current loop described above becomes cause of occurrence of radiation noise. The primary direction of the current flowing from the wave-source-conductor loop P is the horizontal direction. The direction of the current causing occurrence of the radiation noise is a vertical direction to the surface of the mounting substrate 10, but influence of the current can be reduced by forming a conductor loop which includes the ceiling plate section 4 covering the rear surface of the chip part 1, the side plate sections 5, and the ground conductor pattern 11 of the mounting substrate 10 and which is parallel to the direction of the current loop from the chip part 1. That is, by forming such a conductor loop, a current is induced in the side plate sections 5 of the conductor loop in a direction opposite to that of the current flowing through the chip part 1, and hence the electromagnetic field of the current loop of the chip part 1 is cancelled and the radiation noise is reduced.

The simulated results of FIG. 9 indicate how the radiation noise varies when the shielding conductor width (dimension in the front-rear direction) is changed assuming that the shielding conductor height H and the shielding conductor length L (dimension along the horizontal direction) are parameters. In FIG. 9, characteristic a indicates a characteristic when the shielding conductor height H is set to 0.5 mm and the shielding conductor length L is set to 1.08 mm, characteristic b indicates a characteristic when the shielding conductor height H is set to 0.4 mm and the shielding conductor length L is set to 0.68 mm, and characteristic c indicates a characteristic when the shielding conductor height H is set to 0.1 mm and the shielding conductor length L is set to 0.48 mm.

As can be seen from FIG. 9, it is understood that for each of characteristics a, b, and c, the radiation noise can be reduced like an exponential function by increasing the shielding conductor width W. This phenomenon indicates that the radiation noise can be reduced, even when the both side ends in the front-rear direction of the shielding conductor are opened to form the openings 8, if the width of the ceiling plate section 4 (i.e., shielding conductor width W) has a large ratio with respect to the harmonic mean of the height of the ceiling plate section 4 of the shielding conductor 3 (i.e., shielding conductor height H) and the length of the opening 8 in the horizontal direction of the ceiling plate section 4 (i.e., shielding conductor length L) and the shielding effect increases as the width of the ceiling plate section 4 becomes wider. For example, when the width of the ceiling plate section 4 is increased to have a ratio of two or more with respect to the harmonic mean, the radiation noise can be reduced to about one thousandth or less.

In FIG. 9, paying attention to, for example, characteristic b, its harmonic mean is about 0.5 mm, and the shielding conductor width W (i.e., the width of the ceiling plate section 4) at point B is about 0.9 mm, and this value is about twice the value of the harmonic mean. Additionally, at point B, the radiation noise can be reduced to about one thousandth or less as compared with the case in which the shielding conductor (i.e., the ceiling plate section 4) is not used. As above, for the shielding conductor 3, when the width of the opening 8 of the ceiling plate section 4 (shielding conductor width W) is set to be more than the length of the opening 8 of the ceiling plate section 4 (shielding conductor length L) and the height of the ceiling plate section 4 (shielding conductor height H) is reduced to about the thickness of the chip part 1, the shielding effect can be increased. When there exist a plurality of terminals of the chip part, the same effect can be obtained by use of a ceiling plate larger than the existing area of the group of the terminals by at least twice the harmonic mean.

Moreover, the result of simulation can be represented using an approximate expression of a function of the shielding conductor width W, the shielding conductor length L, the shielding conductor height H, and a size Lg of the ground layer 12 of the mounting substrate 10, namely, using the following expression.

$$\text{Radiation noise (relative quantity)} = 0.06 \exp\left(-\left(0.8\pi W + \frac{1.45c}{f}\right) \cdot \sqrt{\frac{1}{L^2} - \left(\frac{2f}{c}\right)^2}\right) +$$

$$0.006 \exp\left(-0.8\pi W \cdot \sqrt{\frac{4}{L^2} - \left(\frac{2f}{c}\right)^2} - \frac{3.1L - 10H}{Lg}\right) +$$

$$0.29 \exp\left(-0.37\pi W \cdot \sqrt{\frac{1}{H^2} + \frac{31}{L^2} - \left(\frac{2f}{c}\right)^2} - \frac{3.1L - 10H}{Lg}\right)$$

wherein, f=frequency and c=speed of light.

In a case in which the size Lg of the ground layer 12 of the mounting substrate 10 is 200 mm and the shielding conductor height H is 0.5 mm, it can be understood that the radiation noise (relative quantity) is reduced to about one 5000th by assigning 1.5 mm to the shielding conductor width W in the front-rear direction from the wave-source-conductor loop P and 1.5 mm to the shielding conductor length L in the horizontal direction in the approximate expression. When the height H, the length L, and the width W are similar to each other, almost the same result is obtained. Furthermore, when the position of the side plate section 5 of the shielding conductor is rotated by 90°, the approximate expression of the result of simulation can be expressed as follows.

$$\text{Radiation noise (relative quantity)} = \exp\left\{-\pi(W - 0.4L) \cdot \sqrt{\frac{1.2}{L^2} - \left(\frac{2f}{c}\right)^2}\right\}$$

According to the approximate expression, when the side plate sections are disposed in the front-rear direction of the wave-source-conductor loop P and the shielding conductor height H is 0.5 mm, the (front-end) shielding conductor length L is 1.5 mm, and the shielding conductor width W is 1.5 mm, the reduction ratio of the radiation noise (relative quantity) is only one tenth. However, in a case in which the shielding conductor height H is 0.5 mm and the (front-end) shielding conductor length L is kept 1.5 mm, when the shielding conductor width W is increased to 3.5 mm, the radiation noise (relative quantity) is reduced to one thousandth. To obtain a sufficient shielding effect regardless of the direction of the wave-source-conductor loop P, it is required to widen the shielding conductor width W to be at least twice the shielding conductor length L. Since the chip part 1 is originally small in size, it is also possible that the length of the chip part 1 is set to that of the shielding conductor and the shielding conductor 3 has a contour in which the width thereof is at least twice that of the length thereof. That is, the shielding conductor 3 can be designed such that each distance from the area in which the electrodes of the wave-source-conductor loop P exist to the opening end of the shielding conductor 3 equal to or more than the length of shielding conductor 3 so that the radiation noise is sufficiently reduced regardless of the direction of the wave-source-conductor loop P.

Additionally, an electromagnetic wave absorbing substance may be disposed in a range R, from the chip part 1 to the opening end of the shielding conductor 3. The substance is one selected from a group including substances using ohmic loss, substances using dielectric loss, and substances using magnetic loss. That is, there can be used, for example, powder of carbon, ferromagnetic ceramics, epoxy resin, ferrite, permalloy, sendust, stainless steel, silicon steel, or iron-based amorphous alloy. Or, it is also possible that a metallic layer such as a nickel plate layer or a chromium plate later having high resistivity is formed on a surface of the shielding conductor, or depressions and projections are formed on the surface of the shielding conductor to increase resistivity.

As an arrangement of the electromagnetic wave absorbing substance, it is possible that a coating film of paint in which fine particles of the electromagnetic wave absorbing substance are mixed with paint solution is formed on the shielding conductor. Or, it is also possible to arrange the electromagnetic wave absorbing substance such that a substance such as epoxy resin or polyamide having a high dielectric dissipation factor is filled in a zone ranging from a chip part end to a shielding conductor end.

By arranging the electromagnetic wave absorbing substance, energy of the electromagnetic wave confined in the shielding conductor 3 can be absorbed to weaken the electromagnetic field in the shielding conductor, and cross talk between circuits in the chip part 1 can be reduced.

As above, by configuring the contour of the shielding conductor 3 into a particular contour in which the width of the ceiling plate section 3 is larger than the length thereof, there can be obtained sufficient shielding effect.

Moreover, in FIGS. 4 and 5, a gap 19 exists at positions at which no shielding bump is disposed between the side plate section 5 of the shielding conductor 3 and the ground conductor pattern 11 of the mounting substrate 10. However, it has been recognized as a result of a simulated calculation that also in such a shielding configuration, a shielding configuration satisfying the following condition is optimal to increase the shielding effect.

(1) When a conductor loop is formed using the ceiling plate section 4, the side plate section 5, and the ground conductor pattern 11 of the mounting substrate 10 and the width of the conductor loop is substantially twice the harmonic mean of the length between the ends of the conductor loop and the height of the ceiling plate section 4, the radiation noise from the current loop as the noise source can be reduced to substantially one thousandth.

Figure 10:
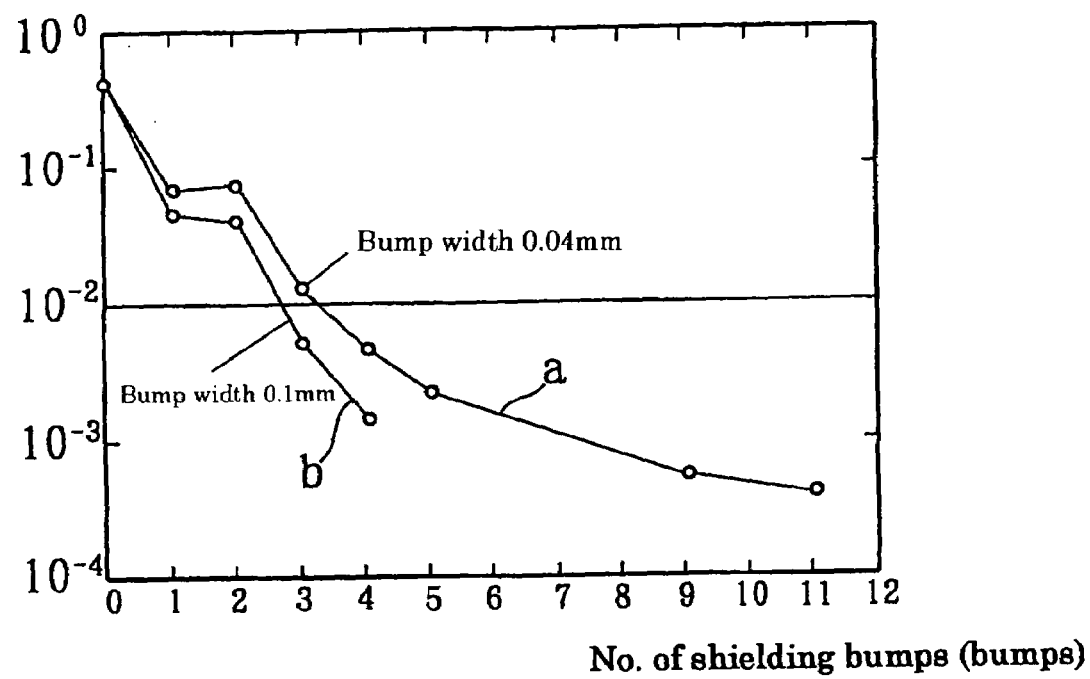
FIG. 10 is a diagram showing a relationship between the number of shielding bumps (abscissa) and the quantity of radiation noise (ordinate) when the shielding conductor is connected to a mounting substrate using shielding bumps in the electronic device.

(2) With the precondition of (1) kept retained, when the number of shielding bumps 17 as electric contacts connecting the planar surface 5A of the side plate section 5 of the shielding conductor 3 and the ground conductor pattern 11 of the mounting substrate 10 is set to four to 11 for each side plate section 5, namely, four or more, there can be obtained a satisfactory shielding effect as shown in FIG. 10.

Particularly, when nine or more shielding bumps 17 are arranged, a sufficiently good shielding effect is obtained. The shielding bumps 17 may be formed in a line on a lower section of the side plate section 5, or may be formed in a zigzag arrangement, or may be formed in two lines; the same effect can be obtained only if the same number of bumps exists.

In FIG. 10, characteristic a indicates an example when the size of width of the shielding bump 17 is set to 0.04 mm and characteristic b indicates an example when the size of width thereof is set to 0.1 mm. As can be seen from FIG. 10, using as a reference the case in which no shielding bump 17 is disposed, the radiation noise can be reduced to substantially one hundredth or less when five bumps 17 are disposed for characteristic a and when four bumps 17 are disposed for characteristic b.

As above, in accordance with the electronic device including chip parts of the example, in the configuration in which the chip part 1 is mounted on a surface of the mounting substrate 10, the rear surface of the chip part 1 is covered with the shielding conductor 3, and the conductor 3 is electrically connected to the ground conductor pattern 11 of the mounting substrate 10; the shielding conductor 3 includes a ceiling plate section 4 over the chip part 1 and side plate sections 5 which are formed to be positioned lower than the ceiling plate section 4 and which are disposed on both sides in the horizontal direction of the chip part 1; moreover, on both sides in the front-rear direction of the chip part 1, openings 8 are formed to open both sides in the front-rear direction of the chip part 1, and the side plate sections 5 of the shielding conductor 3 are electrically connected via a plurality of shielding bumps 17 in the front-rear direction to the ground conductor pattern 11 of the mounting substrate 10; therefore, although both side ends in the front-rear direction of the shielding conductor 3 are open, the shielding effect can be increased by widening the width of the ceiling plate section 4.

Therefore, the shielding effect and the cooling effect can be sufficiently obtained at the same time in the shielding configuration of the chip parts.

Figure 11:
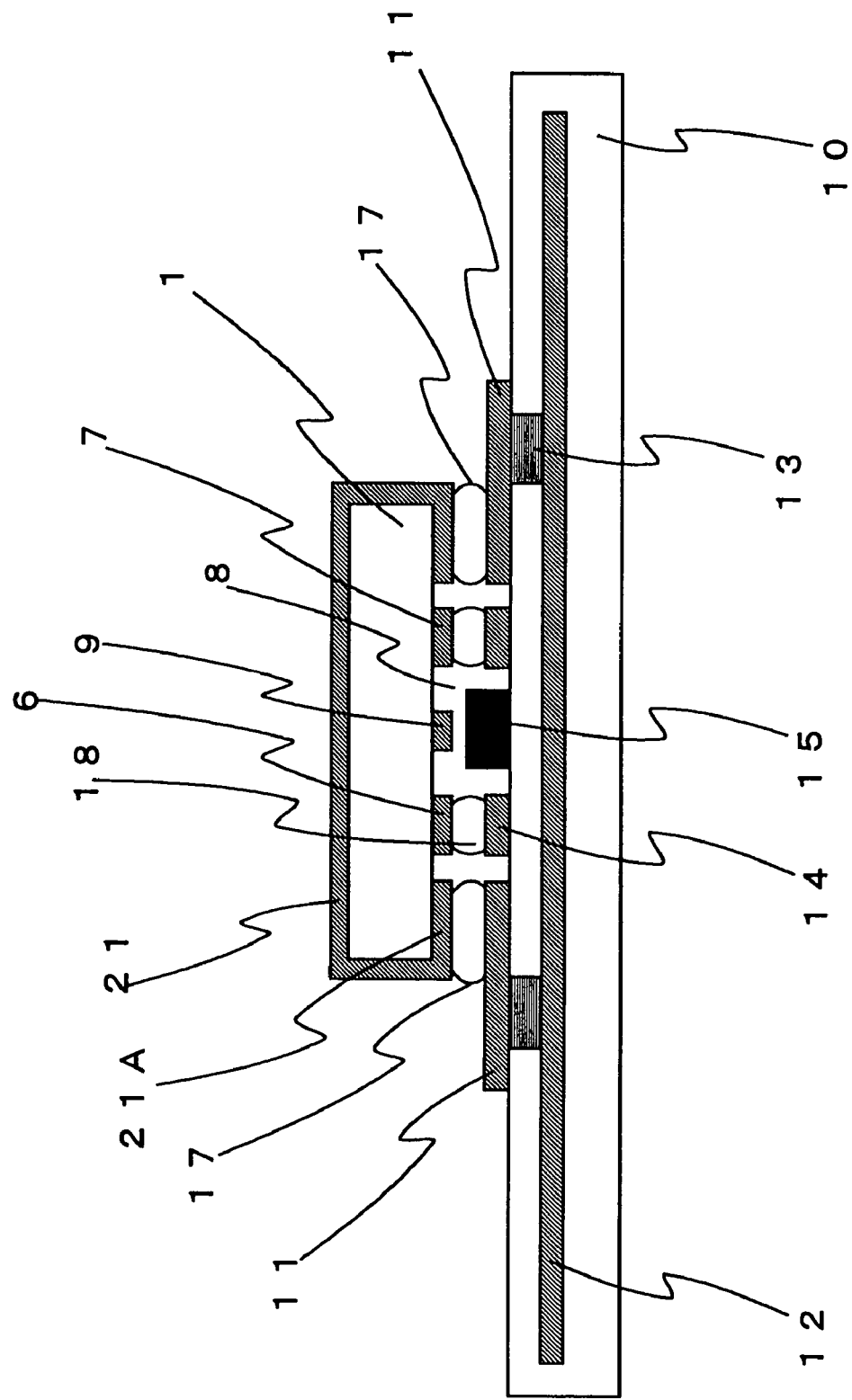
FIG. 11 is a cross-sectional view showing a first variation of the first embodiment.

FIG. 11 is a cross-sectional view showing a first variation of the electronic device including chip parts of the example. The configuration of the first variation remarkably differs from that of the first embodiment described above in that the side surfaces of the chip part are covered with the cathode conductor serving also as a shielding conductor.

That is, in the electronic device including chip parts of the first variation, the rear surface and the side surfaces that function as the cathode of the chip part 1, and part of the surface of the chip part 1 including a vertical cavity surface emitting laser are covered with the shielding conductor serving also as the cathode conductor 21 configured using a conductor plate such as a copper plate or an aluminum plate on one hand, and the surface of the chip part 1 is mounted on a surface of the mounting substrate 10 as shown in FIG. 11. Additionally, both side end surfaces in the horizontal direction of the shielding conductor serving also as the cathode conductor 21 (the flat planes 21A covering part of the surface of the chip part 1) are electrically connected to the ground conductor pattern 11 on the surface of the mounting substrate 10 on one hand, both side end surfaces in the front-rear direction of the shielding conductor 3 are opened to form openings 8.

The other parts are substantially the same as those of the first embodiment described above. Therefore, in FIG. 11, the constituent components corresponding to those of FIGS. 4 and 5 are assigned with the same reference numerals and description thereof is avoided.

In accordance with the first variation, there is obtained an effect substantially the same as that of the first embodiment; additionally, since the surfaces of the chip part 1 opposing respectively the ground conductor pattern 11 and the land pattern 14 of the mounting substrate 10 are formed at substantially the same height, by mounting the chip part 1 on its surface using the shielding bumps 17 and the signal bumps 18 which are almost equal in height, the shielding conductor serving also as the cathode conductor 21 can also be simultaneously connected at the chip mounting without inclining the posture of the chip part 1. Therefore, the chip parts can be mounted in a simple method.

Figure 12:
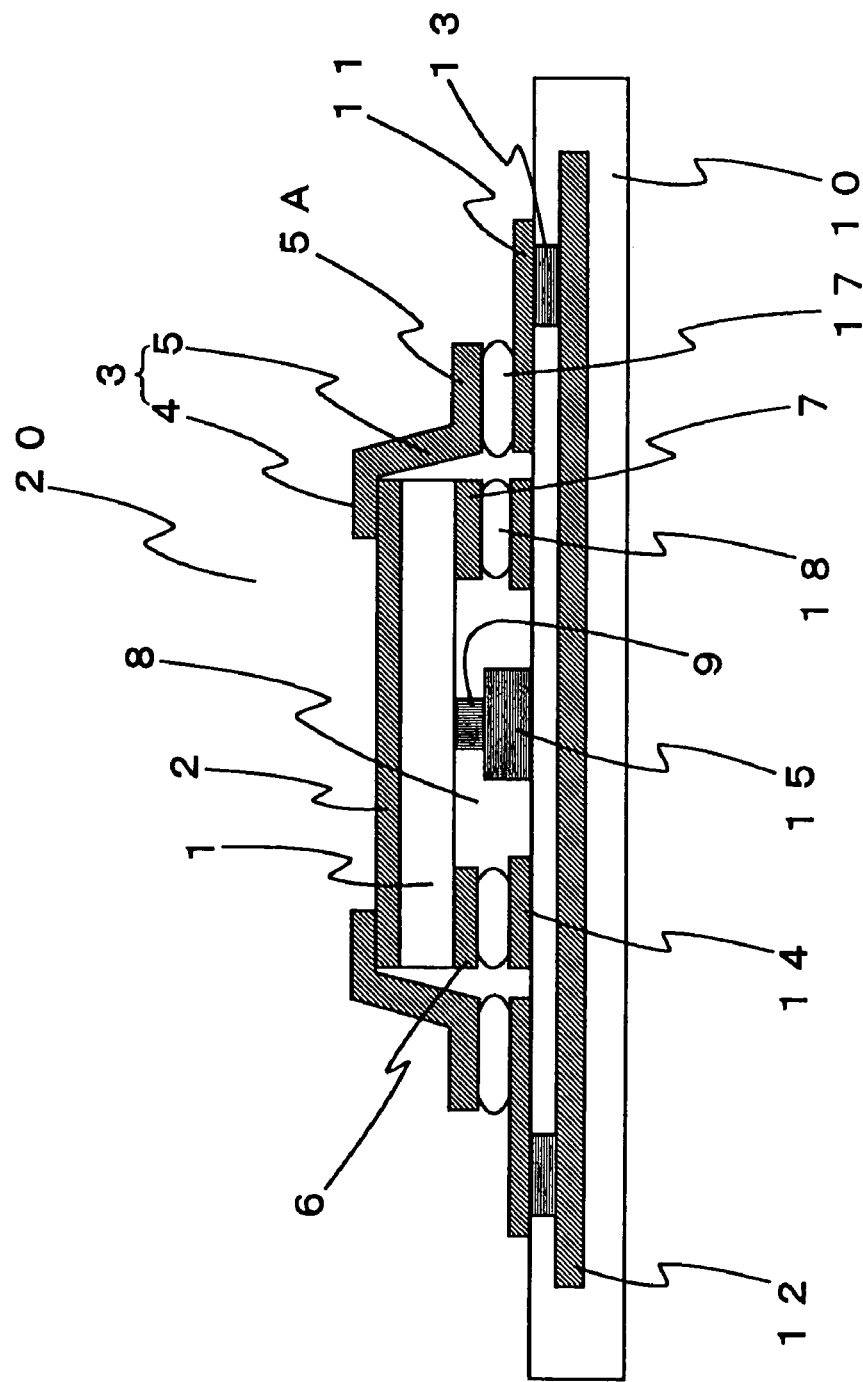
FIG. 12 is a cross-sectional view showing a second variation of the first embodiment.

FIG. 12 is a cross-sectional view showing a second variation of the first embodiment of the electronic device including chip parts of the example. The second variation remarkably differs from that of the first embodiment described above in that a hole section is formed in the ceiling plate section of the shielding conductor.

That is, in the electronic device including chip parts of the second variation, in a central area of the ceiling plate section 4 of the shielding conductor configured with a conductor plate such as a copper plate or an aluminum plate, where the ceiling plate section 4 covers the rear surface of the chip part 1 which functions as the cathode thereof, a hole section 20 is formed to expose the chip part 1 as shown in FIG. 12.

The other parts are substantially the same as those of the first embodiment described above. Therefore, in FIG. 12, the constituent components corresponding to those of FIGS. 4 and 5 are assigned with the same reference numerals and description thereof is avoided.

In accordance with the second variation, there is obtained an effect substantially the same as that of the first embodiment; additionally, since the hole section 20 to expose the chip part 1 is formed in the central area of the ceiling plate section 4 of the shielding conductor 3, the cooling effect of the chip part 1 can be further increased by the hole section 20.

Figure 13:
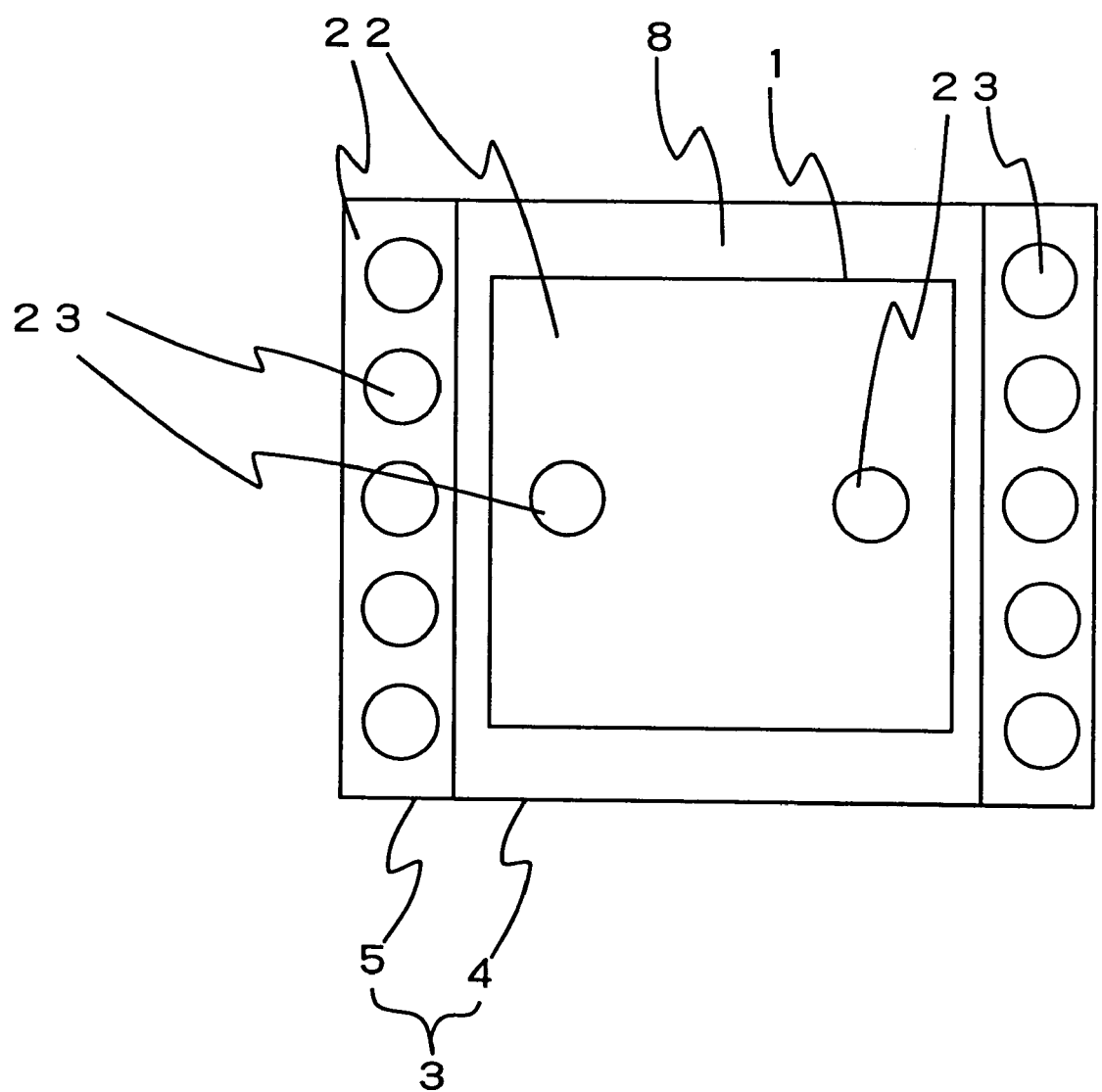
FIG. 13 is a diagram showing a rear surface of a shielding conductor and chip parts in the first manufacturing method of an electronic device.

FIG. 13 is a diagram showing the rear surface of the shielding conductor 3 in the first manufacturing method described above in a stage before the chip part 1 is mounted on the mounting substrate 10 after the chip part 1 is assembled with the shielding conductor 3 into one unit.

As shown in FIG. 13, solder resist 22 is printed on unnecessary areas for the chip part 1 and the shielding conductor 3 formed in one unit, openings 23 are formed by exposing only required areas, solder paste is thereafter printed onto the openings 23 using the solder resist 22 as a mask, and then the solder paste is molten by heat to thereby form shielding bumps 17 and signal bumps 18 each including solder bumps on the flat planes 5A of the side plate sections 5 of the shielding conductor 3 and the anode electrode 6 and the cathode electrode 7 of the chip part 1. In this way, by beforehand forming solder bumps in the required areas of the shielding conductor 3 and the mounting substrate 10, the operation to mount the chip part 1 on the surface of the mounting substrate 10 and the operation to connect the mounting substrate 10 to the ground conductor pattern 11 of the mounting substrate 10 can be simply conducted.

Figure 14:
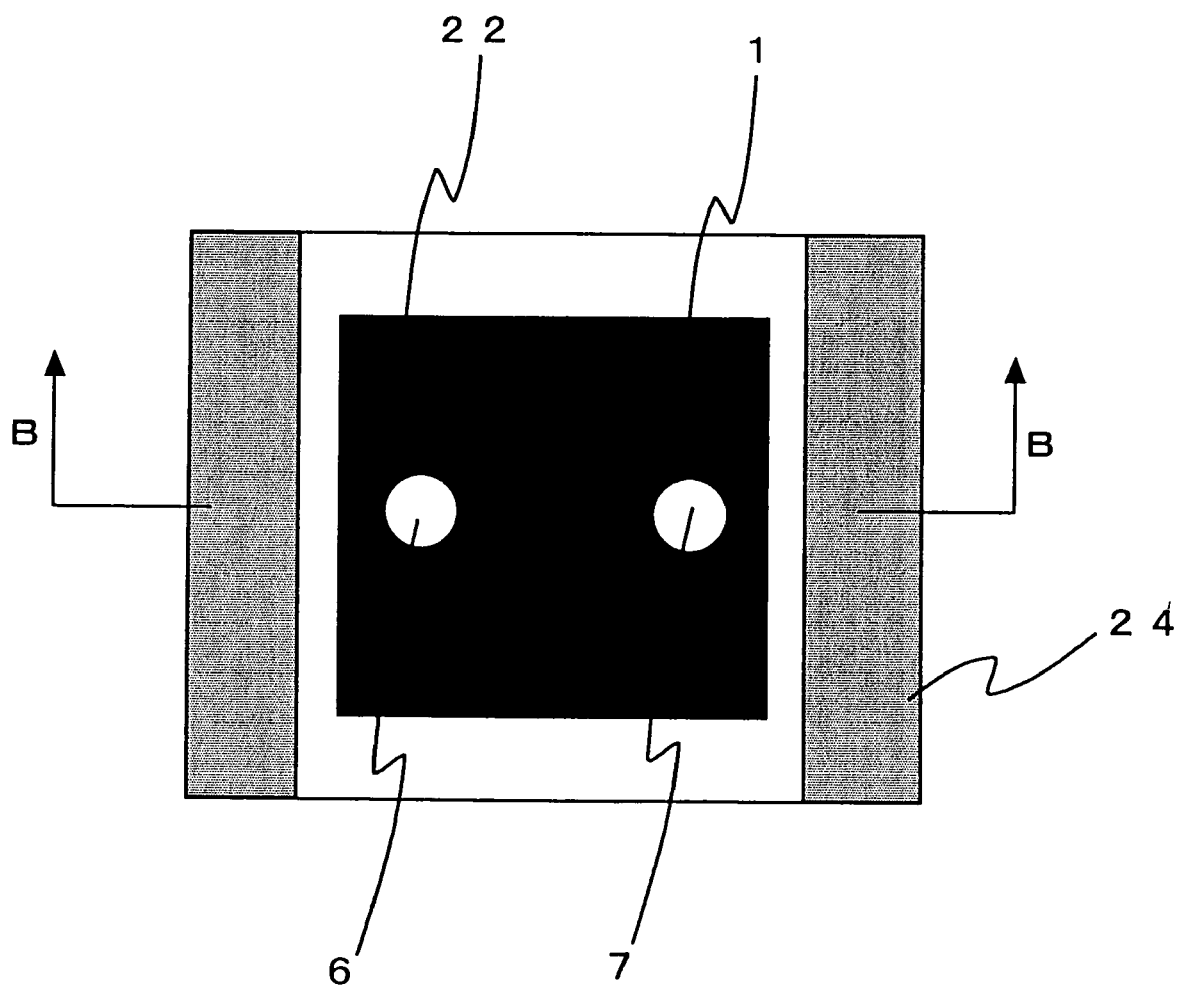
FIG. 14 is a cross-sectional view showing a third variation of a first embodiment.
Figure 15:
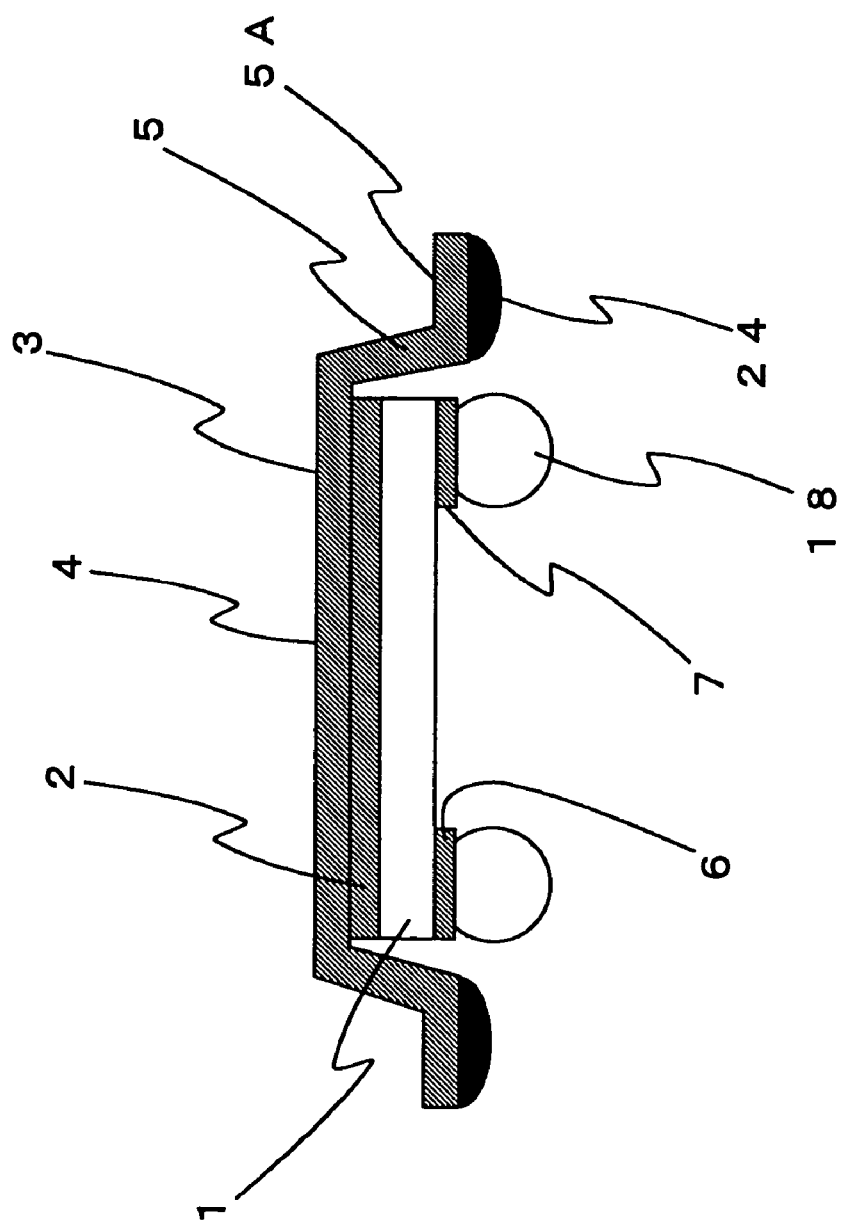
FIG. 15 is a cross-sectional view taken along B—B of FIG. 14.

FIG. 14 is a cross-sectional view showing a third variation of the electronic device including chip parts of the example, and FIG. 15 is a cross-sectional view taken along B—B of FIG. 14. The third variation remarkably differs from that of the first embodiment described above in that a conductor having elasticity is used in place of the shielding bumps.

That is, in the electronic device including chip parts of the third variation, to connect the shielding conductor 3 to the ground conductor pattern 11 of the mounting substrate 10, a conductor 24 having elasticity such as a metallic net or a conductive plastic is used in place of the shielding bumps 17 used in the first embodiment as shown in FIGS. 14 and 15.

For the conductor 24, an electromagnetic wave absorbing substance such as ferrite or carbonyl iron may be used. Moreover, by bringing the conductor 24 into contact with the ground conductor pattern 11 of the mounting substrate 10, electric connection is established.

Two or more conductors 24 may be disposed for each side plate section 5, or a long-sized conductor 24 may be disposed for each side plate section 5. Similarly, in the configuration using shielding bumps, one long-sized shielding bump may be used for each side plate section 5.

Figure 16:
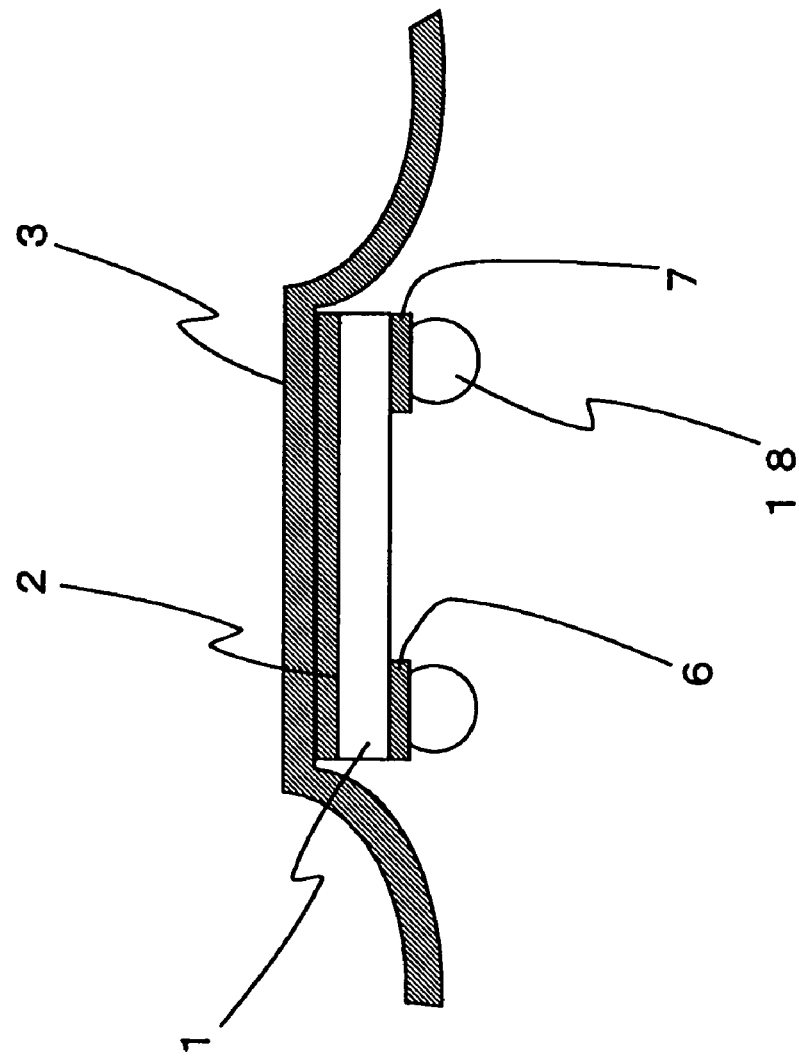
FIG. 16 is a cross-sectional view showing a fourth variation of the first embodiment.

FIG. 16 is a cross-sectional view showing a fourth variation of the electronic device including chip parts of the example. The fourth variation remarkably differs from that of the first embodiment described above in that a spring substance having elasticity is used as the material of the shielding conductor.

That is, in the electronic device including chip parts of the fourth variation, as the shielding conductor 3 to cover the chip part 1, there is used a spring substance having elasticity such as phosphor bronze or stainless steel as shown in FIG. 16.

In accordance with the third and fourth variations, there is obtained an effect substantially the same as that of the first embodiment; additionally, to connect the shielding conductor 3 to the mounting substrate 10, elasticity of the conductor 24 having elasticity or elasticity of the shielding conductor 3 itself is used, and hence the electric connection can be established by a simple unit.

Figure 17:
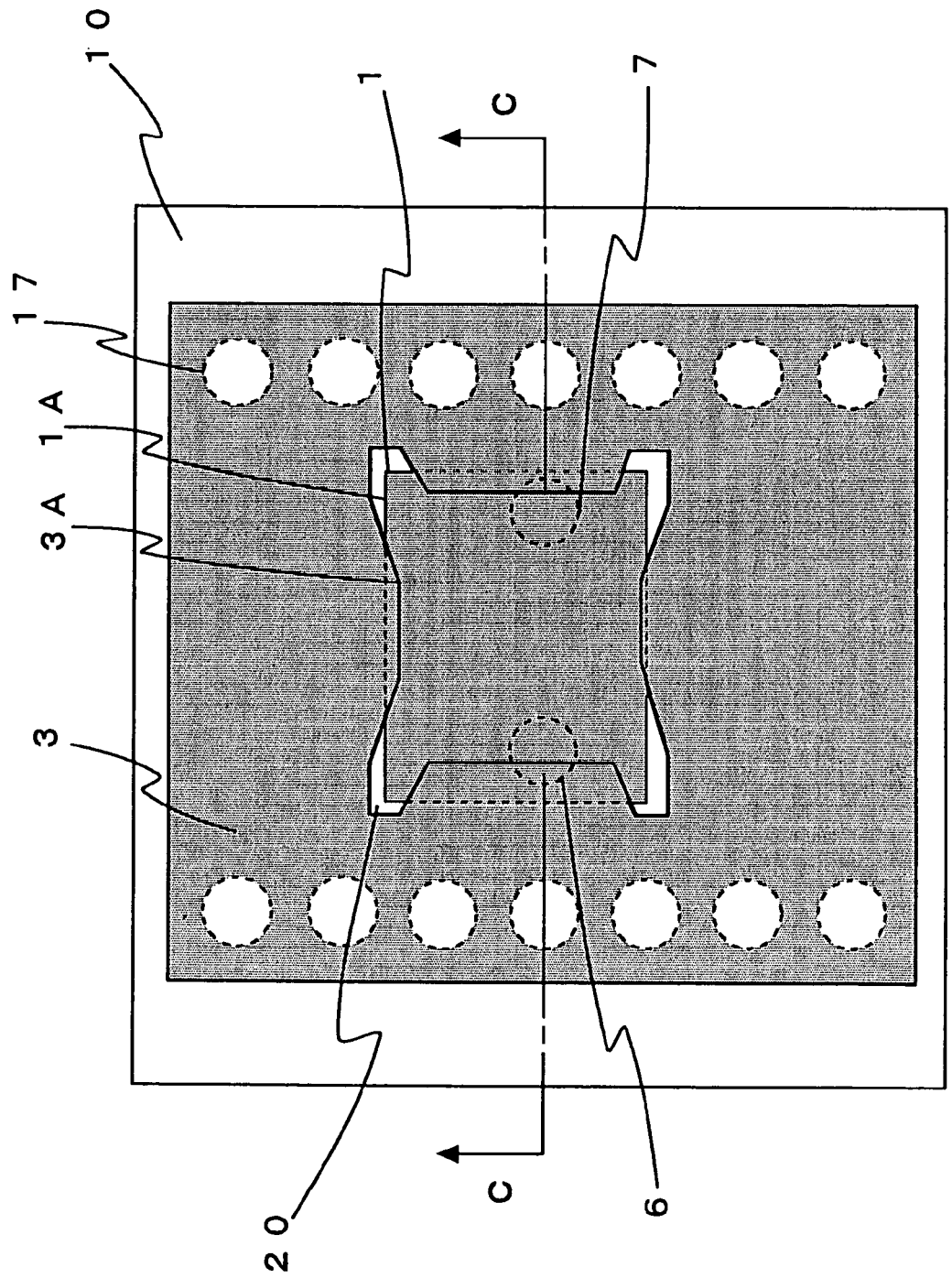
FIG. 17 is a cross-sectional view showing a fifth variation of the first embodiment.
Figure 18:
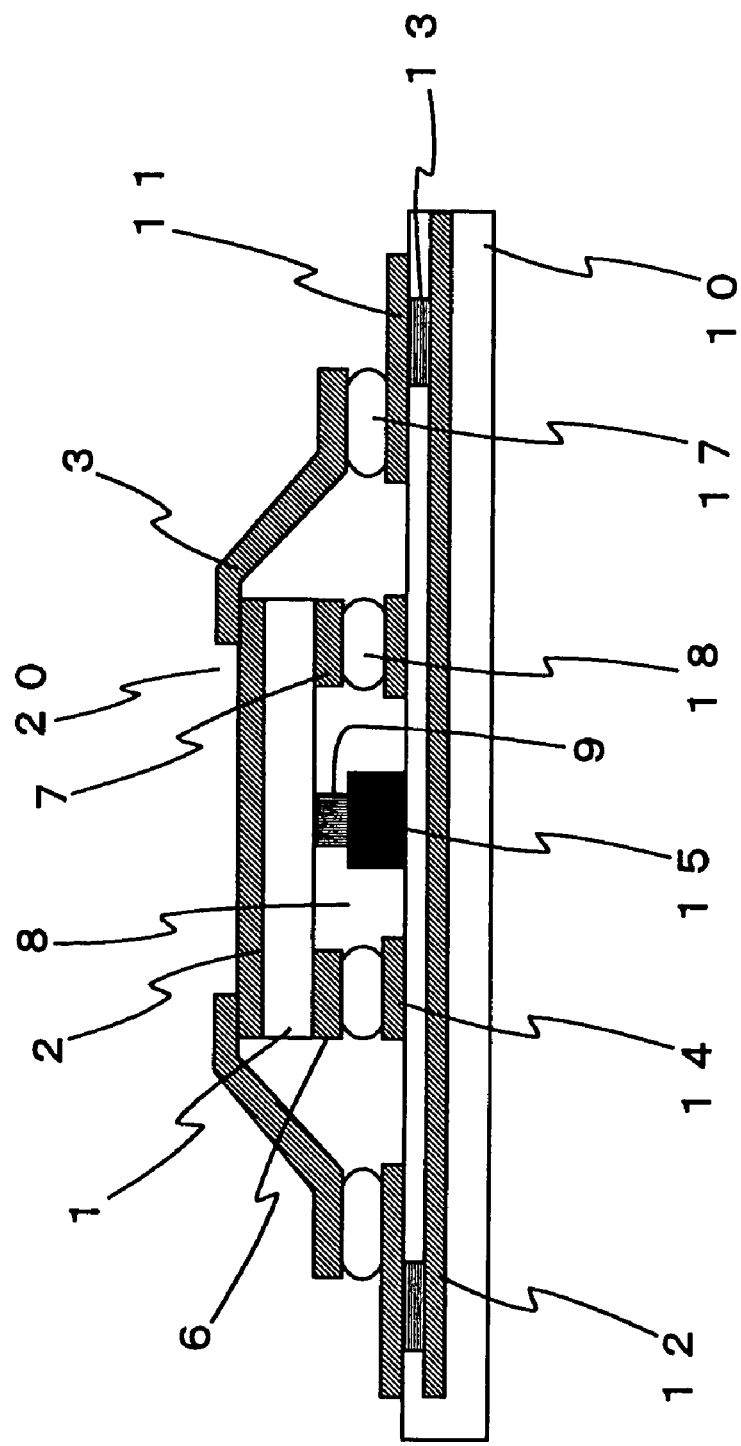
FIG. 18 is a cross-sectional view taken along C—C of FIG. 17.

FIG. 17 is a cross-sectional view showing a fifth variation of the electronic device including chip parts of the example, and FIG. 18 is a cross-sectional view taken along C—C of FIG. 17. The configuration of the fifth variation remarkably differs from that of the first embodiment described above in that the rear surface of the chip part is pushed by spring force of the shielding conductor.

In the electronic device including chip parts of the fifth variation as shown in FIGS. 17 and 18, there is used as the shielding conductor 3 to cover the chip part 1 a shape memory alloy such as a nickel-titanium (Ni—Ti) alloy which restores a characteristic of a spring when heated; and by forming a hole section 20 in the ceiling plate section of the shielding conductor, end sections 1A of the chip part 1 are pushed by the spring characteristic of a projection part 3A projecting into the hole section 20. For the insertion and removal of the chip part 1 into and from the mounting substrate 10, the shape memory metal undergoes plastic deformation to insert and to remove the chip part 1 into and from the mounting substrate 10 through the hole section 20. As a result, at occurrence of a defect in the chip part 1, the part replacement can be simply conducted. Moreover, by disposing the hole section 20 at a plurality of positions, it is possible to push a plurality of chip parts 1 by one shielding conductor 3.

In accordance with the fifth variation, there is obtained an effect substantially the same as that of the first embodiment; additionally, with the shielding conductor 3 kept connected to the mounting substrate 10, the shielding conductor 3 undergoes plastic deformation to thereby conduct the insertion and the removal of the chip part 1 into and from the mounting substrate 10, and it is hence easy to conduct the insertion and the removal of the chip part.

Moreover, it is also possible that both ends of a film-shaped metallic foil having plasticity as the shielding conductor 3 are fixed by adhesion onto the conductor pattern 11 of the mounting substrate 10 to push by tension thereof the shielding conductor 3 onto the chip part 1 to thereby install it on the mounting substrate 10.

Second Embodiment

Figure 19:
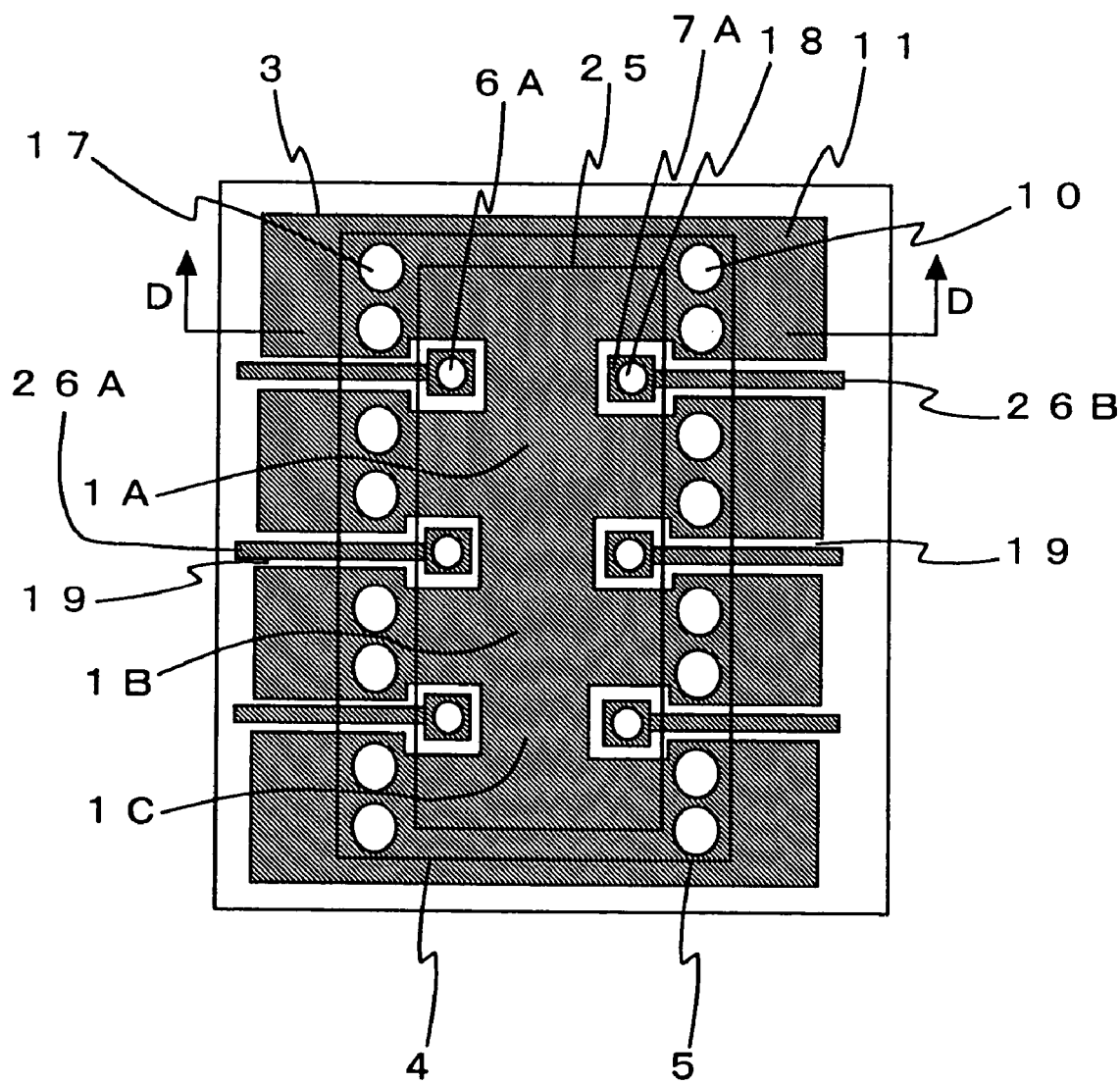
FIG. 19 is a plan view showing a second embodiment of an electronic device including chip parts in accordance with the present invention.
Figure 20:
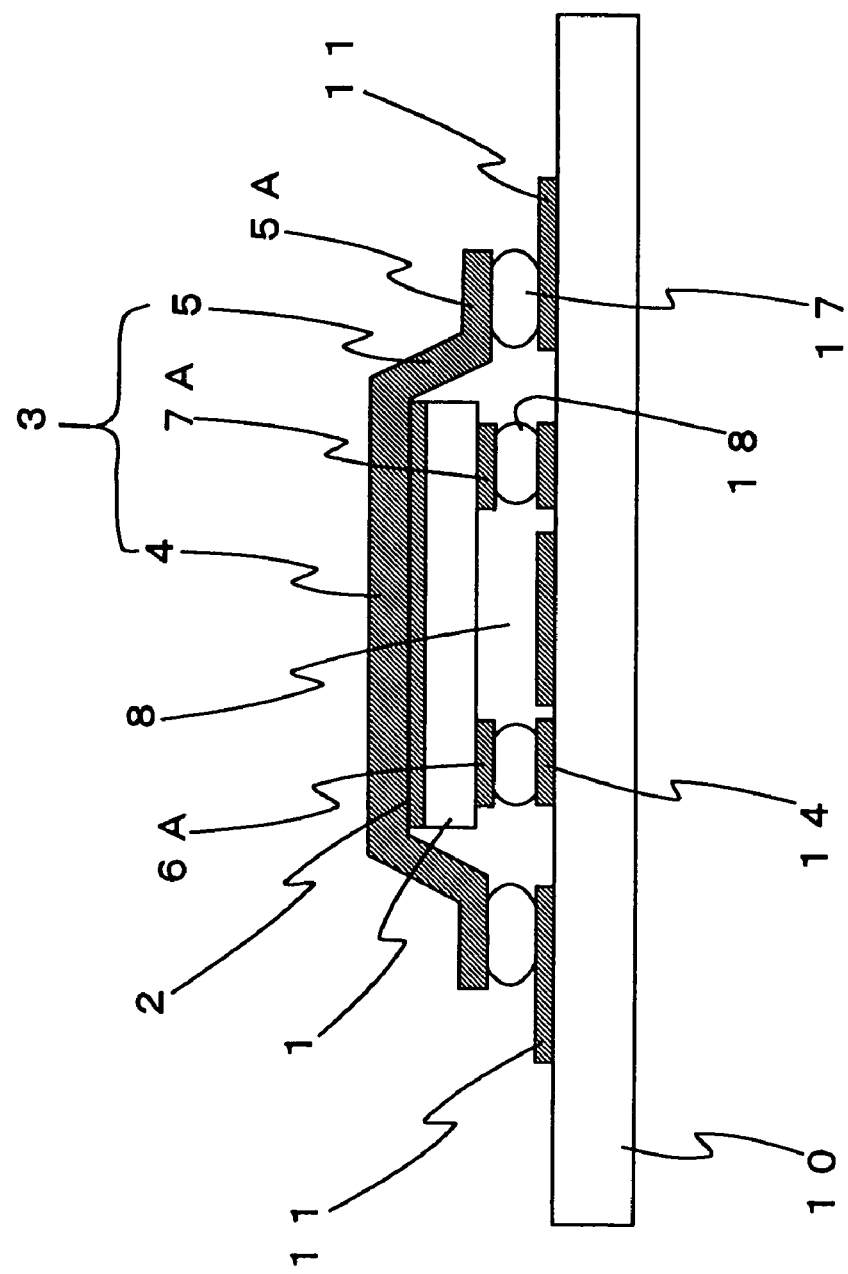
FIG. 20 is a cross-sectional view taken along D—D of FIG. 19.

FIG. 19 is a plan view showing a second embodiment of the electronic device including chip parts in accordance with the present invention and FIG. 20 is a cross-sectional view taken along D—D of FIG. 19. The configuration of the second embodiment remarkably differs from that of the first embodiment described above in that an array-shaped chip part in which a plurality of two-terminal chip parts are integrated is used as the chip part. To the array-shaped chip part, an array-shaped photodiode, an array-shaped signal amplifier circuit, or the like is applicable.

In the electronic device including chip parts of this example, as shown in FIGS. 19 and 20, the rear surface serving as a common cathode 2 of the array-shaped chip part 25 in which a plurality of two-terminal chip parts 1A, 1B, and 1C including, for example, vertical cavity surface emitting lasers are integrated is covered with the shielding conductor 3 on one hand, the surface of the array-shaped chip part 25 is mounted on the surface of the mounting substrate 10. Additionally, both side end surfaces in the horizontal direction of the shielding conductor 3 which are the flat planes 5A of the side plate sections 5 are electrically connected to the ground conductor pattern 11 on the surface of the mounting substrate 10 on one hand, and both side ends in the front-rear direction of the shielding conductor 3 are opened to form openings 8.

In the array-shaped chip part 25, a plurality of two-terminal chip parts 1A to 1C are integrated in the front-rear direction, and hence the width of the ceiling plate section 4 of the shielding conductor 3 covering the array-shaped chip part 25 is selected to be wider than that of the first embodiment. Additionally, the distance from each of the electrodes 6A and 7A of the two-terminal chip part 1A arranged on the outer-most side in the front-rear direction of the array-shaped chip part 25 to an end section in the front-rear direction of the shielding conductor 3 is set to at least half the horizontal size of the ceiling plate section 4. Like in the first embodiment, a current path is formed in the horizontal direction to couple both electrodes 6A and 7A with each other.

On the surface as the mounting surface of the two-terminal chip parts 1A to 1C constituting the array-shaped chip part 25, the anode electrodes 6A and the cathode electrodes 7A are respectively formed, and at positions opposing the anode electrodes 6A and the cathode electrodes 7A on the surface of the mounting substrate 10, land patterns 14 respectively including copper layers are formed.

In the configuration of a pair of side plate sections 5 of the shielding conductor 3, the flat planes 5A are electrically connected to the ground conductor pattern 11 on the surface of the mounting substrate 10 via eight shielding bumps 17 in the front-rear direction. Furthermore, the anode electrode 6A and the cathode electrode 7A of each of the two-terminal chip parts 1A to 1C are connected to surface layer electric wirings 26A and 26B formed in the horizontal direction, at positions in a gap 19 in which the shielding bump 17 is not disposed between the side plate sections 5 of the shielding conductor 3 and the ground conductor pattern 11 of the mounting substrate 10. In a rectangular area formed by linking the positions at which shielding bumps are disposed below the right and left side plate sections 5, the shielding bumps 17 are disposed such that the area is larger than the area in which the electrodes of the chip part exist. The shielding bumps 17 are desirably disposed such that the distance from each of the electrodes 6A and 7A of the two-terminal chip part to the end section in the front-rear direction of the area in which the shielding bumps are disposed is at least half the horizontal size of the ceiling plate section 4.

Incidentally, the space area between the ceiling plate section 4 of the shielding conductor 3 and the mounting substrate 10 may be filled with organic resin having a dielectric dissipation factor of 2% or more such as epoxy resin or polyamide resin. When such organic resin is filled therein, there can be obtained an effect that a loss takes place in resonance of the electromagnetic field occurring in the space area to reduce the influence of the electromagnetic field.

As above, in accordance with the configuration of the example, since the width of the ceiling plate section of the shielding conductor is selected to be wider than that of the first embodiment, there can be obtained a stronger shielding effect because of the reason described in conjunction with the first embodiment.

Third Embodiment

Figure 21:
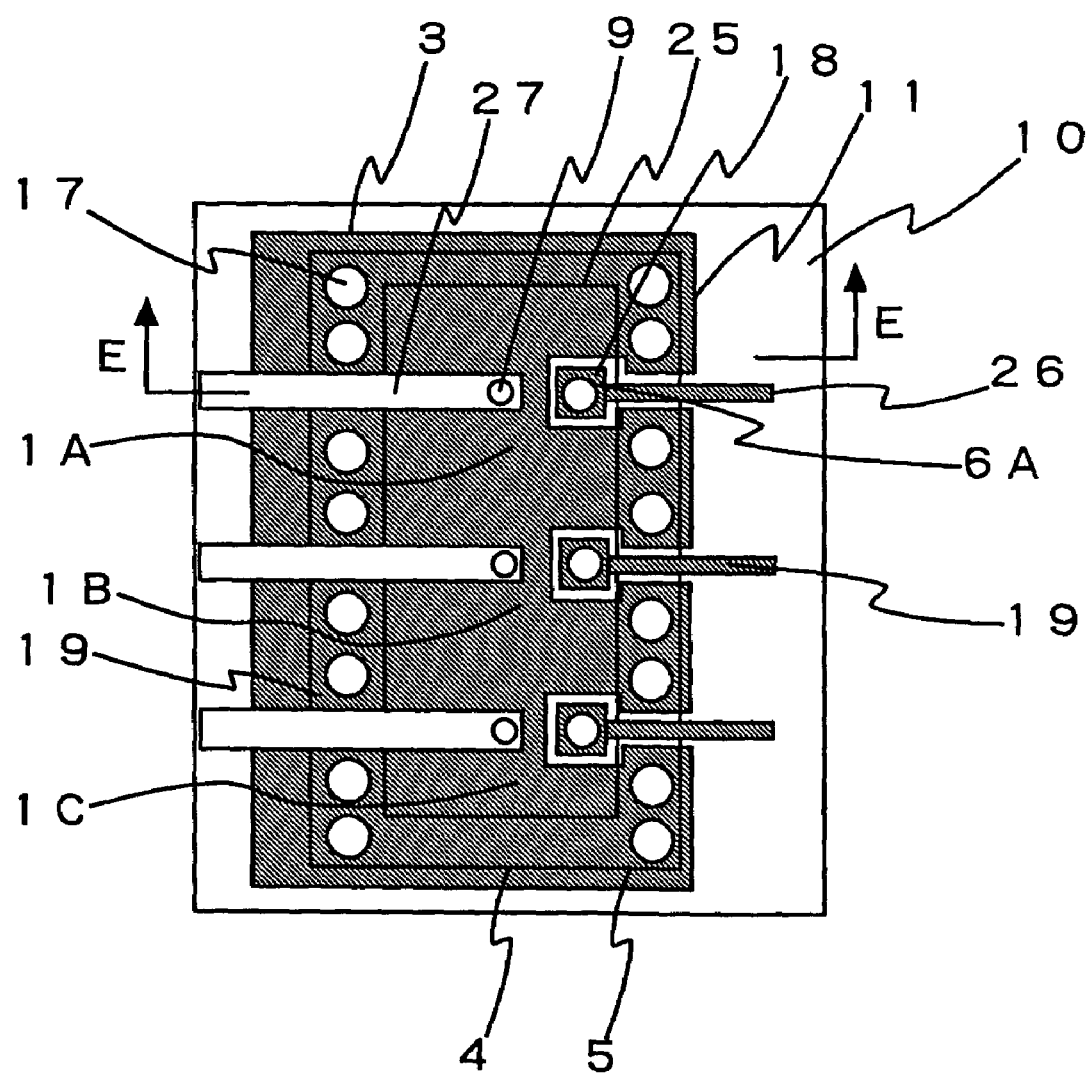
FIG. 21 is a plan view showing a third embodiment of an electronic device including chip parts in accordance with the present invention.
Figure 22:
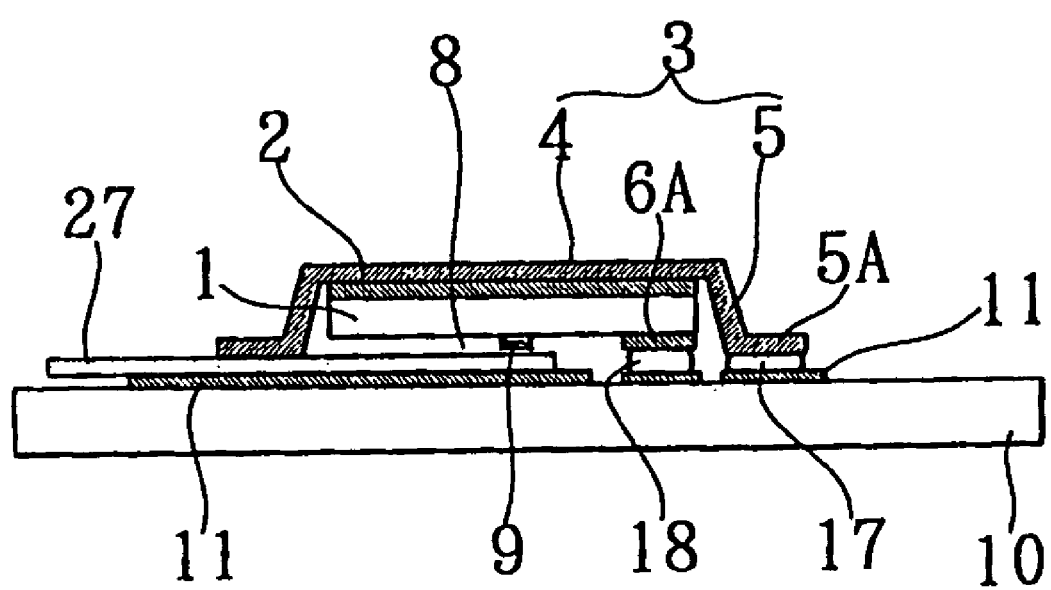
FIG. 22 is a cross-sectional view taken along E—E of FIG. 21.

FIG. 21 is a plan view showing a third embodiment of the electronic device including chip parts in accordance with the present invention and FIG. 22 is a cross-sectional view taken along E—E of FIG. 21. The configuration of the third embodiment remarkably differs from that of the second embodiment described above in that in the configuration including an array-shaped chip part in which a plurality of two-terminal chip parts are integrated is used as the chip part, an optical waveguide is arranged in the horizontal direction to input and to guide an optical signal from a light emitting section. In this connection, it is assumed that in the two-terminal chip part used in this example, the cathode electrode is formed only on the rear surface, and only the anode electrode is formed on the mounting surface.

In the electronic device including chip parts of the example, as shown in FIGS. 21 and 22, an optical waveguide 27 to input and to guide an optical signal from a light emitting section 9 formed on the mounting surfaces of the two-terminal chip parts 1A to 1C constituting the array-shaped chip part 25 is arranged in the horizontal direction at a position in a gap 19 of the left-side side plate section 5 in which the shielding bump 17 is not disposed between the side plate sections 5 of the shielding conductor 3 and the ground conductor pattern 11 of the mounting substrate 10. On the other hand, the anode electrode 6A of the two-terminal chip parts 1A to 1C is connected to the surface layer electric wiring 26 formed in the horizontal direction at a position in a gap 19 of the right-side side plate section 5 in which the shielding bump 17 is not disposed between the side plate sections 5 of the shielding conductor 3 and the ground conductor pattern 11 of the mounting substrate 10. Furthermore, the distance from the anode electrode 6A of the two-terminal chip parts 1A arranged on the outer-most side in the front-end direction of the array-shaped chip part 25 to the end section in the front-end direction of the shielding conductor 3 is set to be at least half the horizontal size of the ceiling plate section 4.

The others are substantially the same as those of the second embodiment described above. Therefore, in FIGS. 21 and 22, the constituent components corresponding to those of FIGS. 19 and 20 are assigned with the same reference numerals and description thereof is avoided.

As above, in accordance with the configuration of the example, when an array-shaped chip part in which a plurality of two-terminal chip parts are integrated is used as the chip part and only one of the electrodes is formed on the mounting surface of each two-terminal chip part, there can be obtained a stronger shielding effect because of the reason described in the first embodiment. That is, the cathode electrode of the chip part 1 is electrically connected to the shielding conductor 3 and is electrically connected via the side plate sections 5 as both side surfaces in the horizontal direction of the shielding conductor 3 to the ground conductor pattern 11 on the surface of the mounting substrate 10. Moreover, the anode electrode 6A is connected to the surface layer electric wiring 26 of the mounting substrate 10, and a current flowing from the anode electrode 6A of the chip part 1 makes a pair with a current flowing through the side plate sections 5 as both side surfaces in the horizontal direction up to the ground conductor pattern 11 on the surface of the mounting substrate 10 to form a current loop circulating in a direction vertical to the plane of the mounting substrate 10 to form the wave-source-conductor loop P shown in FIG. 8. The loop P cancels the electric field appearing when a current is induced in an opposite direction in a conductor loop including the ceiling plate section 4, the side plate sections 5, and the ground conductor pattern 11 of the mounting substrate 10, and hence the radiation noise is reduced.

Incidentally, as for the current flowing through the respective terminals, as the current pair flowing through the electrodes existing on the left end of the chip part 1, a current is induced in the opposite direction in the side plate section 5 connected to the left end of the ceiling plate section 4; for the current flowing through the electrodes existing in the right end of the chip part 1, a current is induced in the opposite direction in the side plate section 5 connected to the right end of the ceiling plate section 4, and hence the electromagnetic field is cancelled to thereby reduce the radiation noise. Therefore, a pair including one terminal and the side plate section 5 connected to the cathode electrode can be considered to be one two-terminal chip part, and there is considered an array-shaped chip part in which a plurality of chip parts are integrated. Therefore, the power source terminal, the ground terminal, and the signal terminal are not formed on the front and rear ends of the chip part 1; and for a chip part 1 in which the power source terminal, the ground terminal, and the signal terminal exist only on the upper surface of the chip part 1 or in the right and left ends of the chip part 1, the shielding effect of this embodiment can be similarly obtained. For example, the power source terminal is considered to be a two-terminal part paired with the cathode terminal on the upper surface of the chip part 1, and the electromagnetic field caused by a current flowing through the power source terminal is cancelled. Therefore, also for a plurality of circuits in which the power source terminal exists in addition to the signal terminal, the present embodiment is applicable to a chip part 1 in which all terminals exist only on the right and the left of the chip part 1. That is, the present embodiment is applicable particularly to a signal amplifier circuit generating a large quantity of heat.

As above, the description has been given in detail of embodiments of this invention by referring to the drawings; however, specific configurations are not restricted by this embodiments, but modifications of the design in the range within the scope of the invention are also included in this invention. For example, although each embodiment has been described using an example in which a vertical cavity surface emitting laser is used as the two-terminal chip part, the invention can be applied not only to a vertical cavity surface emitting laser but also to other two-terminal chip parts such as a chip capacitor and a chip resistor. Moreover, the invention can be applied to multi-terminal chip parts as an array-shaped chip part used in the second embodiment. When the invention is applied to a general multi-terminal chip part and the shielding conductor width W is configured such that the length from the area in which the terminals of the chip part exist to the opening end of the shielding conductor 3 is secured to be equal to or more than the shielding conductor length, there can be obtained a shielding effect to sufficiently reduce the radiation noise.

Additionally, by using the configuration in which a plurality of chip parts are arranged to be united with one shielding conductor 3 including the side plate sections 5 with the chip parts covered by the shielding conductor 3 and the distance between the opening 8 of the shielding conductor 3 and the terminals of the chip part is secured to be at least the length L of the shielding conductor, there can be obtained a shielding effect to sufficiently reduce the radiation noise.

In addition, the shielding conductor 3 is not limited to a copper plate, an aluminum plate, or the like, but there can also be used other conductive substances such as a silicon substrate and conductive resin. As the shielding conductor 3, a metallic film coated with organic resin may be used. Insulator may exist between the shielding conductor 3 and the chip part 1. Furthermore, although each embodiment has been described using an example in which shielding bumps such as solder bumps are used to connect the shielding conductor with the mounting substrate, the present invention is not restricted by the example, but it is also possible that the shielding conductor 3 is brought into contact with the ground conductor pattern 11 and the shielding conductor 3 is fixed onto the mounting substrate 10 by a screw or by compression bonding as in the third variation of the first embodiment. Or, there may also be used other connecting substance such as a thermoplastic conductive adhesive agent. Moreover, the chip part size, the shielding conductor size, the anode electrode size, the cathode electrode size, the shielding bump size, and the signal bump size are examples, and hence it is possible to change the sizes according to a purpose, a usage, and the like, for example, to replace the bump with a conductor post or a conductor lead line while observing the condition that a polygonal area formed by coupling the positions at which the shielding bumps are disposed has a contour enclosing the signal bumps and the power source terminals of the chip part 1.

Additionally, the present invention can be used not only in a case in which the unit including the chip part 1 and the shielding conductor 3 is mounted on the surface of the mounting substrate 10 but also in a case in which the unit is mounted by burying the unit in the mounting substrate 10 as below. That is, first, the unit including the chip part 1 and the shielding conductor 3 exemplified in FIG. 19, 20, or 11 is covered with organic resin such as epoxy resin or alamide resin. Next, the chip part 1 is installed on the mounting substrate 10 with the anode electrode 6 and the cathode electrode 7 of the chip part 1 and the flap planes 5A of the side plate sections 5 of the shielding conductor 3 facing the surface of the mounting substrate 10. Thereafter, the mounting substrate 10 and the chip part 1 are coated with organic resin. Thereafter, abrasion by a laser beam or chemical etching is conducted on the surface of the coating resin of the mounting substrate 10 to form holes, and the anode electrode 6 and the cathode electrode 7 of the chip part 1 and the flat planes 5A of the side plate sections 5 of the shielding conductor 3 are exposed through the holes. The holes replace the signal bumps 18 and the shielding bumps 17 in the case of the surface mounting. On the anode electrode 6 and the cathode electrode 7 of the chip part 1 and the flat planes 5A of the side plate sections 5 of the shielding conductor 3 exposed through the holes and the surface of the coating resin are plated using conductor to form surface layer wirings 26A and 26B and the ground conductor pattern 11 to establish an electric connection therebetween. In this case, by connecting the right and left ground conductor patterns 11 of the chip part 1 using a conductor pattern and by connecting the anode electrode 6 and the cathode electrode 7 to the surface layer electric wirings 26A and 27A passing through the gap 19 between the holes formed in the flat planes 5A of the side plate sections 5 of the shielding conductor 3 as shown in FIG. 19, it is possible to conduct the mounting to connect the electric wiring, the chip part 1, and the shielding conductor 3.

INDUSTRIAL APPLICABILITY

As described above, in accordance with the electronic device including chip parts of this invention, in the configuration in which the chip part is mounted on the surface of the mounting substrate, the upper surface of the chip part is coated with the shielding conductor, and the shielding conductor is electrically connected to the ground layer of the mounting substrate; the shielding conductor includes a ceiling plate section covering the chip part and side plate sections which are formed to be united with the ceiling plate section and to be at a position lower than the ceiling plate section and which are arranged on both sides in the horizontal direction of the chip part; furthermore, in the both side ends in the front-rear direction of the shielding conductor, openings are formed to open the both sides in the front-rear direction of the chip part, and the side plate sections of the shielding conductor are electrically connected via a plurality of connecting units in the front-rear direction to the ground layer of the mounting substrate. Therefore, although the both side ends in the front-rear direction of the shielding conductor are opened, the shielding effect can be increased by widening the width of the ceiling plate section.

Therefore, in the shielding configuration of the chip part, the shielding effect and the cooling effect can be sufficiently obtained at the same time.

The invention claimed is:
1. An electronic device, comprising:
a chip part having an upper surface;
a shielding conductor united with the upper surface of the chip part, the shielding conductor including a ceiling plate section covering the chip part and opposed side plate sections united with and extending below the ceiling plate section and projecting in a horizontal direction around two sides of the chip part; and a mounting substrate having a ground layer, wherein the side plate sections are electrically connected to the ground layer via a plurality of connecting means, wherein a width W of the ceiling plate section in a front-rear direction is sized greater than or equal to twice a harmonic mean of a length L of the ceiling plate section in a horizontal direction between the opposed side plate sections and a height H of the ceiling plate section in a vertical direction above the mounting substrate.

2. An electronic device, comprising:

a chip part having an upper surface;

a mounting substrate having a mounting surface and a ground layer, wherein the chip part is mounted on the mounting surface of the mounting substrate; and a shielding conductor comprising: a ceiling plate section united with the upper surface of the chip part and covering the chip part; and opposed side plate sections united with and extending below the ceiling plate section and projecting in a horizontal direction around two sides of the chip part, wherein the shielding conductor forms openings in a front-rear direction of the shielding conductor and a front-rear direction of the chip part;

wherein the opposed side plate sections of the shielding conductor are electrically connected to the ground layer of the mounting substrate via a plurality of connecting means extending in a front-rear direction; and wherein a width W of the ceiling plate section in a front-rear direction is sized greater than or equal to twice a harmonic mean of a length L of the openings in a horizontal direction between the opposed side plate sections and a height H of the ceiling plate section in a vertical direction above the mounting substrate.

3. An electronic device, comprising:

a chip part having an upper surface;

a mounting substrate having a mounting surface and a ground layer, wherein the chip part is mounted on the mounting surface of the mounting substrate;

a shielding conductor comprising: a ceiling plate section united with the upper surface of the chip part and covering the chip part;

opposed side plate sections united with and extending below the ceiling plate section and projecting in a horizontal direction around two sides of the chip part; and opposed opening end sections projecting in a front-rear direction of the shielding conductor and the chip part;

wherein the opposed side plate sections are electrically connected to the ground layer of the mounting substrate via a plurality of connecting means extending in the front-rear direction; and an electromagnetic wave absorber disposed between the chip part and at least one of the opposed opening end sections of the shielding conductor, wherein a width W of the ceiling plate section in a front-rear direction is sized greater than or equal to twice a harmonic mean of a length L of the ceiling plate section in a horizontal direction between the opposed side plate sections and a height H of the ceiling plate section in a vertical direction above the mounting substrate.

4. An electronic device in accordance with claim 1, wherein the chip part further comprises:

a two-terminal chip part.

5. An electronic device in accordance with claim 1, wherein the width W of the shielding conductor is larger than an area defined by terminals of the chip part.

6. An electronic device in accordance with claim 2, wherein the openings formed by the shielding conductor are of a size larger than an area defined by terminals of the chip part, by at least a length L of the openings in the horizontal direction of the ceiling plate section.

7. An electronic device in accordance with claim 1, wherein the plurality of connecting means comprises more than four connecting means.

8. An electronic device in accordance with claim 1, further comprising:

a hole section formed in the ceiling plate section of the shielding conductor to expose at least a portion of the chip part.

9. An electronic device in accordance with claim 1, wherein the shielding conductor further comprises:

a spring substance having an elasticity.

10. An electronic device in accordance with claim 1, wherein the shielding conductor further comprises:

a shape memory metal having a characteristic of a spring;

a hole section formed in the shape memory metal to expose at least a portion of the chip part, the hole section further including end sections, wherein the chip part is pushed by spring characteristics of the end sections of the hole section.

11. An electronic device in accordance with claim 1, wherein the ceiling plate section, the opposed side plate sections, and a part of the upper surface of the chip part covered by the shielding conductor also serve as a cathode conductor.

12. An electronic device in accordance with claim 1, wherein the connecting means further comprises:

a bump or a conductor having an elasticity.

13. An electronic device in accordance with claim 1, wherein the chip part further comprises:

an array-shaped chip part including a plurality of two-terminal chip parts integrated in a front-rear direction.

14. An electronic device in accordance with claim 13, further comprising:

two electrodes formed on a mounting surface of the two-terminal chip parts and both of the electrodes are connected to surface layer electric wiring formed in the horizontal direction.

15. An electronic device in accordance with claim 14, wherein only one of the two electrodes is formed on a mounting surface of each of a plurality of two-terminal chip parts.

16. An electronic device in accordance with claim 15, further comprising:

the one of the two electrodes is connected to a surface layer electric wiring formed in the horizontal direction; and an optical waveguide arranged in the horizontal direction in the mounting substrate below the array-shaped chip part.

17. A method of manufacturing an electronic device including a chip part mounted on a surface of a mounting substrate, a shielding conductor united with and covering an upper surface of the chip part, wherein the shielding conductor is electrically connected to a ground layer of the mounting substrate, the method of manufacturing comprising:
- assembling the chip part with the shielding conductor into a unit, the shielding conductor including a ceiling plate section united to and covering the chip part, and opposed side plate sections united with the ceiling plate section and extending below the ceiling plate section and projecting in a horizontal direction around two sides of the chip part;
- arranging on the mounting substrate in which the ground layer is formed the shielding conductor assembled with the chip part into the unit;
- mounting the chip part on a surface of the mounting substrate, and electrically connecting the shielding conductor to the ground layer at the same time, and
- sizing a width W of a ceiling plate section of a shielding conductor in a front-rear direction greater than or equal to twice a harmonic mean of a length L of the ceiling plate section in a horizontal direction between opposed side plate sections and a height H of the ceiling plate section in a vertical direction above the mounting substrate.

18. A method of manufacturing an electronic device including a chip part mounted on a surface of a mounting substrate, a shielding conductor united with and covering an upper surface of the chip part, wherein the shielding conductor is electrically connected to a ground layer of the mounting substrate, the method of manufacturing comprising:
- arranging the chip part on the mounting substrate on which a ground layer is formed, and mounting the chip part on a surface of the mounting substrate; and
- sizing a width W of a ceiling plate section of a shielding conductor in a front-rear direction greater than or equal to twice a harmonic mean of a length L of the ceiling plate section in a horizontal direction between opposed side plate sections and a height H of the ceiling plate section in a vertical direction above the mounting substrate, wherein the opposed side plate sections are united with the ceiling plate section and extend below the ceiling plate section and project in a horizontal direction around two sides of the chip part;
- arranging the shielding conductor on the mounting substrate;
- electrically connecting the shielding conductor to the ground layer; and
- covering an upper surface of the chip part with the ceiling plate section.

19. A method of manufacturing an electronic device including a chip part in accordance with claim 17, further comprising:
- using a plurality of connecting means when electrically connecting the shielding conductor to the ground layer.

* * * * *